US012793776B2

(12) United States Patent
Yang et al.

(10) Patent No.: US 12,793,776 B2
(45) Date of Patent: Nov. 10, 2026

(54) DEVICE-REGION LAYOUT FOR EMBEDDED FLASH

(71) Applicant: Taiwan Semiconductor Manufacturing Company, Ltd., Hsinchu (TW)

(72) Inventors: Shih Kuang Yang, Tainan City (TW); Ping-Cheng Li, Kaohsiung City (TW); Hung-Ling Shih, Tainan City (TW); Po-Wei Liu, Tainan City (TW); Wen-Tuo Huang, Tainan City (TW); Yu-Ling Hsu, Tainan City (TW); Yong-Shiuan Tsair, Tainan City (TW); Chia-Sheng Lin, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 302 days.

(21) Appl. No.: 18/760,318

(22) Filed: Jul. 1, 2024

(65) Prior Publication Data

US 2024/0355393 A1 Oct. 24, 2024

Related U.S. Application Data

(60) Continuation of application No. 18/321,975, filed on May 23, 2023, now Pat. No. 12,068,032, which is a (Continued)

(51) Int. Cl.
*G11C 16/08* (2006.01)
*G11C 11/16* (2006.01)
(Continued)

(52) U.S. Cl.
CPC .......... *G11C 16/08* (2013.01); *G11C 11/1657* (2013.01); *H10B 12/053* (2023.02); *H10B 41/30* (2023.02)

(58) Field of Classification Search
CPC . G11C 16/08; G11C 11/1657; G11C 16/0433; H10B 12/053; H10B 41/30;
(Continued)

(56) References Cited

U.S. PATENT DOCUMENTS 9,287,280 B2 3/2016 Tsao et al.
9,842,844 B2 12/2017 Wu et al.
(Continued)

FOREIGN PATENT DOCUMENTS

JP 2014203898 A 10/2014

OTHER PUBLICATIONS

Notice of Allowance dated Aug. 21, 2020 for U.S. Appl. No. 16/400,361.
(Continued)

*Primary Examiner* — Allison Bernstein
(74) *Attorney, Agent, or Firm* — Eschweiler & Potashnik, LLC

(57) ABSTRACT

Various embodiments of the present application are directed towards an integrated memory chip with an enhanced device-region layout for reduced leakage current and an enlarged word-line etch process window (e.g., enhanced word-line etch resiliency). In some embodiments, the integrated memory chip comprises a substrate, a control gate, a word line, and an isolation structure. The substrate comprises a first source/drain region. The control gate and the word line are on the substrate. The word line is between and borders the first source/drain region and the control gate and is elongated along a length of the word line. The isolation structure extends into the substrate and has a first isolation-structure sidewall. The first isolation-structure sidewall extends laterally along the length of the word line and underlies the word line.

20 Claims, 15 Drawing Sheets

Related U.S. Application Data continuation of application No. 17/506,904, filed on Oct. 21, 2021, now Pat. No. 11,699,488, which is a continuation of application No. 16/952,411, filed on Nov. 19, 2020, now Pat. No. 11,158,377, which is a division of application No. 16/400,361, filed on May 1, 2019, now Pat. No. 10,861,553.

(60) Provisional application No. 62/737,288, filed on Sep. 27, 2018.

(51) Int. Cl.
*H10B 12/00* (2023.01)
*H10B 41/30* (2023.01)

(58) Field of Classification Search
CPC ........ H10B 41/42; H10B 41/10; H10B 69/00; H10B 41/40; H10B 41/50; H10D 30/6892; H10D 64/035; H10D 84/00
See application file for complete search history.

(56) References Cited

U.S. PATENT DOCUMENTS

| | | | | |
|---|---|---|---|---|
| 10,943,913 | B2 * | 3/2021 | Huang | H10B 41/10 |
| 11,127,827 | B2 * | 9/2021 | Hsu | H10B 41/30 |
| 11,785,770 | B2 * | 10/2023 | Huang | G11C 16/08 257/316 |
| 2011/0115000 | A1 | 5/2011 | Yang | |
| 2015/0333082 | A1 | 11/2015 | Chuang et al. | |
| 2016/0190146 | A1 | 6/2016 | Zhang et al. | |
| 2016/0307911 | A1 | 10/2016 | Wu et al. | |
| 2017/0110469 | A1 | 4/2017 | et al. | |
| 2018/0151581 | A1 | 5/2018 | Wu et al. | |
| 2018/0182772 | A1 | 6/2018 | Lin et al. | |
| 2018/0233509 | A1 | 8/2018 | Cai et al. | |
| 2020/0098877 | A1 | 3/2020 | Hsu et al. | |
| 2020/0105775 | A1 | 4/2020 | Huang et al. | |

OTHER PUBLICATIONS

Notice of Allowance dated Jun. 25, 2021 for U.S. Appl. No. 16/952,411.
Non-Final Office Action dated Dec. 7, 2022 for U.S. Appl. No. 17/506,094.
Notice of Allowance dated Mar. 1, 2023 for U.S. Appl. No. 17/506,094.
Non-Final Office Action dated Dec. 21, 2023 for U.S. Appl. No. 18/321,975.
Notice of Allowance dated Apr. 9, 2024 for U.S. Appl. No. 18/321,975.

* cited by examiner

DEVICE-REGION LAYOUT FOR EMBEDDED FLASH

REFERENCE TO RELATED APPLICATIONS

This Application is a Continuation of U.S. application Ser. No. 18/321,975, filed on May 23, 2023, which is a Continuation of U.S. application Ser. No. 17/506,904, filed on Oct. 21, 2021 (now U.S. Pat. No. 11,699,488, issued on Jul. 11, 2023), which is a Continuation of U.S. application Ser. No. 16/952,411, filed on Nov. 19, 2020 (now U.S. Pat. No. 11,158,377, issued on Oct. 26, 2021), which is a Divisional of U.S. application Ser. No. 16/400,361, filed on May 1, 2019 (now U.S. Pat. No. 10,861,553, issued on Dec. 8, 2020), which claims the benefit of U.S. Provisional Application No. 62/737,288, filed on Sep. 27, 2018. The contents of the above-referenced Patent Applications are hereby incorporated by reference in their entirety.

BACKGROUND

Embedded flash is flash memory that is integrated with logic devices on a common integrated circuit (IC) chip. The integration improves performance by eliminating interconnect structures between chips and reduces manufacturing costs by sharing process steps between the flash memory and the logic devices. Some types of flash memory include stacked gate flash memory and split gate flash memory. Split gate flash memory has lower power consumption, higher injection efficiency, less susceptibility to short channel effects, and over erase immunity compared to stacked gate flash memory.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
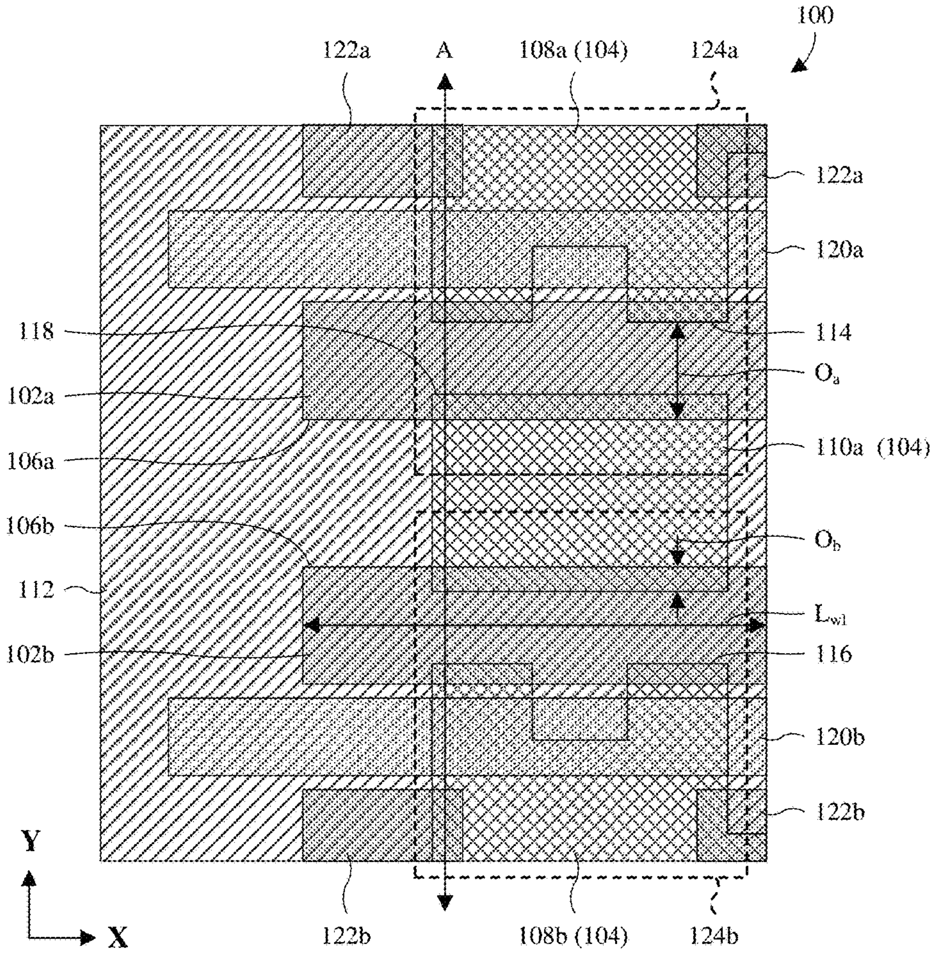
FIG. 1 illustrates a top layout of some embodiments of an integrated memory chip comprising an enhanced device-region layout according to aspect of the present application.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory device may, for example, comprise a substrate, a first word line, a second word line, a first source/drain region, and a second source/drain region. The first and second word lines overlie a device region of the substrate and are elongated in parallel along respective word-line lengths. The device region is demarcated by an isolation structure and has a first device-region protrusion and a second device-region protrusion. The first device-region protrusion protrudes across the first word line in a direction crosswise to the word-line lengths and terminates at a first device-region sidewall of the substrate. The second device-region protrusion protrudes across the second word line in a direction crosswise to the word-line lengths and terminates at a second device-region sidewall of the substrate. The first and second device-region sidewalls adjoin the isolation structure and are laterally between and laterally spaced from the first and second word lines. The first and second source/drain regions are on the device region, respectively at the first and second device-region sidewalls. Further, the first and second source/drain regions are between and respectively border the first and second word lines.

During formation of the memory device, etching and/or cleaning processes recess a portion of the isolation structure at the first and second device-region sidewalls to below a top surface of the substrate, thereby defining a recess exposing the first and second device-region sidewalls. A challenge is that silicide may form on the first and second device-region sidewalls during a silicide process performed after forming the first and second word lines. The silicide may, in turn, result in leakage paths to a bulk of the substrate from the first and second source/drain regions. Further, during use of the memory device, the leakage paths may extend to source lines of the memory device along selectively-conductive channels underlying the first and second word lines. This extension may lead to read and/or write failure. Another challenge is that the recess decreases an etch process window (e.g., etch resiliency) during formation of the first and second word lines. Forming the first and second word lines may, for example, comprise: depositing a conductive layer; depositing an anti-reflective coating (ARC) on the conductive layer; and performing an etch into the ARC and the conductive layer with a photoresist mask in place to form a word-line pattern in the ARC and the conductive layer. Because of the recess, the conductive layer may be indented at the recess and the ARC may have an increased thickness at the recess. The increased thickness leads to increased etch loading, such that it takes longer to etch through a portion of the ARC at the recess than other portions of the ARC. As a result, the word-line pattern may not be accurately formed in the conductive layer. Conductive etch residue may persist and define a leakage path between the first and second word lines, thereby leading to failure of memory cells along the first and second word lines.

Various embodiments of the present application are directed towards an integrated memory chip with an enhanced device-region layout for reduced leakage current and an enlarged word-line etch process window (e.g., enhanced word-line etch resiliency). In some embodiments, the integrated memory chip comprises a substrate, a first word line, a second word line, and a source/drain region. The first and second word lines overlie a first device region of the substrate and a second device region of the substrate, and are elongated in parallel along respective word-line lengths. The first and second device regions are demarcated, and electrically separated from each other, by an isolation structure. The second device region is between and borders the first and second word lines. The first device region wraps around the second device region and has a first device-region protrusion and a second device-region protrusion respectively on opposite sides of the second device region. The first device-region protrusion protrudes under the first word line in a first direction crosswise to the word-line lengths and terminates at a first device-region sidewall of the substrate. The second device-region protrusion protrudes under the second word line in a second direction crosswise to the word-line lengths and terminates at a second device-region sidewall of the substrate. The first and second device-region sidewalls adjoin the isolation structure and face the second device region. Further, the first and second device-region sidewalls respectively underlie the first and second word lines. The source/drain region is on the second device region and is between and borders the first and second word lines.

During formation of the memory device, etching and/or cleaning processes may, for example, recess portions of the isolation structure at the first and second device-region sidewalls, thereby defining a first recess portion and a second recess portion respectively exposing the first and second device-region sidewalls. Because the first and second word lines overlie the first and second device-region sidewalls, the first and second word lines may, for example, fill the first and second recess portions and cover the first and second device-region sidewalls. This may, for example, prevent silicide from forming on the first and second device-region sidewalls during a silicide process performed after forming the first and second word lines. By preventing silicide from forming on the first and second device-region sidewalls, leakage paths to a bulk of the substrate may be prevented from forming and yields may be enhanced.

During formation of the first and second word lines, a conductive layer and an ARC may, for example, be sequentially deposited. Further, an etch may, for example, be performed into the ARC and the conductive layer to form the first and second word lines. While performing the etch, a portion of the conductive layer and a portion of the ARC on the second device region are removed, thereby defining opposing sidewalls respectively of the first and second word lines. Because the second device region is a different material than the isolation structure, the second device region is not subject to the recessing of the isolation structure and hence has a planar or substantially planar top surface. Accordingly, the conductive layer and the ARC each form with a uniform or substantially uniform thickness and a planar or substantially planar top surface at the second device region. This leads to uniform or substantially uniform etch loading at the second device region. The uniform or substantially uniform etch loading reduces the likelihood of etch residue remaining and electrically shorting the first and second word lines together. Hence, the uniform or substantially uniform etch loading may enlarge the process window (e.g., resiliency) of the etch.

With reference to FIG. 1, a top layout 100 of some embodiments of an integrated memory chip comprising an enhanced device-region layout is provided. As seen hereafter, the enhanced device-region layout is "enhanced" in that it may lead to reduced leakage current and/or an enlarged word-line etch process window. A first word line 102*a* and a second word line 102*b* are on a substrate 104 and are elongated in parallel along respective word-line lengths $L_{w1}$. Note that only one of the word-line lengths $L_{w1}$ is labeled. The first word line 102*a* has a first word-line sidewall 106*a* facing the second word line 102*b*, and the second word line 102*b* has a second word-line sidewall 106*b* facing the first word line 102*a*. The substrate 104 may be or comprise, for example, a bulk monocrystalline silicon substrate, a silicon-on-insulator (SOI) substrate, or some other suitable semiconductor substrate.

The substrate 104 has a first erase-side device region 108*a*, a second erase-side device region 108*b*, and a word-line-side device region 110*a*. The first and second erase-side device regions 108*a*, 108*b* and the word-line-side device region 110*a* correspond to top regions of the substrate 104 (when viewed in cross section) that are surrounded and demarcated by an isolation structure 112. The isolation structure 112 provides electrical and physical isolation between the first and second erase-side device regions 108*a*, 108*b* and the word-line-side device region 110*a*. The isolation structure 112 may be or comprise, for example, silicon oxide and/or some other suitable dielectric material(s) and/or may be or comprise, for example, a shallow trench isolation (STI) structure or some other suitable isolation structure.

The first erase-side device region 108*a* protrudes towards the first word line 102*a* in a first direction crosswise to the word-line lengths $L_{w1}$ and terminates at first device-region sidewalls 114. Similarly, the second erase-side device region 108*b* protrudes towards the second word line 102*b* in a second direction crosswise to the word-line lengths $L_{w1}$ and terminates at second device-region sidewalls 116. Note that only one of the first device-region sidewalls 114 is labeled 114 and only one of the second device-region sidewalls 116 is labeled 116. The first and second device-region sidewalls 114, 116 respectively underlie the first and second word lines 102*a*, 102*b* and are offset respectively from the first and second word-line sidewalls 106*a*, 106*b* by a first offset $O_a$. In some embodiments, the first and second erase-side device regions 108*a*, 108*b* are independent of each other. In other embodiments, the first and second erase-side device regions 108*a*, 108*b* are connected outside the illustrated portion of the integrated memory chip and are hence one and the same.

The word-line-side device region 110*a* is between the first and second erase-side device regions 108*a*, 108*b* and has a pair of third device-region sidewalls 118. Note that only one of the third device-region sidewalls 118 is labeled. The third device-region sidewalls 118 are respectively on opposite sides of the word-line-side device region 110*a* and respectively face the first and second erase-side device regions 108*a*, 108*a*. Further, the third device-region sidewalls 118 respectively underlie the first and second word lines 102*a*, 102*b* and are offset respectively from the first and second word-line sidewalls 106*a*, 106*b* by a second offset $O_b$ less than the first offset $O_a$. In alternative embodiments, the third device-region sidewalls 118 are laterally between and spaced from the first and second word lines 102*a*, 102*b*, such that the third device-region sidewalls 118 do not underlie the first and second word lines 102*a*, 102*b* (e.g., the second offset $O_b$ is negative). The word-line-side device region 110*a* may, for example, have a top layout that is square, rectangular, or some other suitable shape.

During formation of the integrated memory chip, etching and/or cleaning processes may, for example, recess portions of the isolation structure 112 at the first and second device-region sidewalls 114, 116, thereby exposing the first and second device-region sidewalls 114, 116. Because the first and second word lines 102*a*, 102*b* overlie the first and second device-region sidewalls 114, 116, the first and second word lines 102*a*, 102*b* may, for example, prevent silicide from forming on the first and second device-region sidewalls 114, 116 during a silicide process performed after forming the first and second word lines 102*a*, 102*b*. This, in turn, may prevent leakage paths to a bulk of the substrate 104 and may enhance yields.

In some embodiments, the first offset $O_a$ is between about 10-150 nanometers, about 10-80 nanometers, or about 80-150 nanometers. Other values for the first offset $O_a$ are, however, amenable. If the first offset $O_a$ is too small (e.g., less than about 10 nanometers or some other suitable value), the first and second device-region sidewalls 114, 116 may still be exposed during a silicide process performed after forming the first and second word lines 102*a*, 102*b*. For example, the etching and/or cleaning processes that recess the first and second word lines 102*a*, 102*b* may laterally etch the isolation structure 112 at the first and second device-region sidewalls 114, 116. The lateral etching may undercut the first and second word lines 102*a*, 102*b* and expose the first and second device-region sidewalls 114, 116 if the first offset $O_a$ is too small. If the first offset $O_a$ is too large (e.g., greater than about 150 nanometers or some other suitable value), the first and second word lines 102*a*, 102*b* would be oversized since the first and second device-region sidewalls 114, 116 underlie the first and second word lines 102*a*, 102*b*. As such, material would be wasted and a memory-array size would be larger than needed.

During formation of the first and second word lines 102*a*, 102*b*, a conductive layer and an ARC may, for example, be sequentially deposited. Further, an etch may, for example, be performed into the ARC and the conductive layer to form the first and second word lines 102*a*, 102*b*. While performing the etch, a portion of the conductive layer and a portion of the ARC on the word-line-side device region 110*a* are removed, thereby defining the first and second word-line sidewalls 106*a*, 106*b*. Because the word-line-side device region 110*a* is a different material than the isolation structure 112, the word-line-side device region 110*a* is not subject to the recessing of the isolation structure 112 and has a planar or substantially planar top surface (when viewed in cross section). Accordingly, the conductive layer and the ARC each form with a uniform or substantially uniform thickness and a planar or substantially planar top surface at the word-line-side device region 110*a*. This leads to uniform or substantially uniform etch loading at the word-line-side device region 110*a*. The uniform or substantially uniform etch loading reduces the likelihood of etch residue remaining and electrically shorting the first and second word lines 102*a*, 102*b* together. Hence, the word-line-side device region 110*a* may enlarge the process window (e.g., resiliency) of the etch.

A first control gate 120*a*, a second control gate 120*b*, a first erase gate 122*a*, and a second erase gate 122*b* are on the substrate 104. The first control gate 120*a* and the first erase gate 122*a* are on the first erase-side device region 108*a*, and the first control gate 120*a* is between and borders the first erase gate 122*a* and the first word line 102*a*. Similarly, the second control gate 120*b* and the second erase gate 122*b* are on the second erase-side device region 108*b*, and the second control gate 120*b* is between and borders the second erase gate 122*b* and the second word line 102*b*. The first and second word lines 102*a*, 102*b*, the first and second control gates 120*a*, 120*b*, and the first and second erase gates 122*a*, 122*b* are elongated in parallel in a first dimension (e.g., an X dimension) and are further laterally spaced from each other in a second dimension (e.g., a Y dimension) transverse to the first dimension.

In some embodiments, the first and second erase gates 122*a*, 122*b* are discontinuous in the first dimension. In other embodiments, the first and second erase gates 122*a*, 122*b* are continuous in the first dimension. In some embodiments, the first and second word lines 102*a*, 102*b* are discontinuous in the first dimension. In other embodiments, the first and second word lines 102*a*, 102*b* are continuous in the first dimension. In some embodiments, the first and second word lines 102*a*, 102*b*, the first and second control gates 120*a*, 120*b*, and the first and second erase gates 122*a*, 122*b* are or comprise doped polysilicon, metal, some other suitable conductive material(s), or any combination of the foregoing.

In some embodiment, a first boundary cell 124*a* and a second boundary cell 124*b* are on the word-line-side device region 110*a* and are respectively on the first and second erase-side device regions 108*a*, 108*b*. The first boundary cell 124*a* is defined in part by the first word line 102*a*, the first control gate 120*a*, and the first erase gate 122*a*, whereas the second boundary cell 124*b* is defined in part by the second word line 102*b*, the second control gate 120*b*, and the second erase gate 122*b*. The first and second boundary cells 124*a*, 124*b* are unused or dummy cells at an edge or boundary of a memory array that offset memory and strap cells of the memory array from the edge or boundary. The first and second boundary cells 124*a*, 124*b* are unused because there is a large change in feature density at the edge or boundary of the memory array. This large change in feature density leads to a high degree of process non-uniformity, whereby the first and second boundary cells 124*a*, 124*b* are non-uniform and hence unsuitable for use.

Figure 2A:
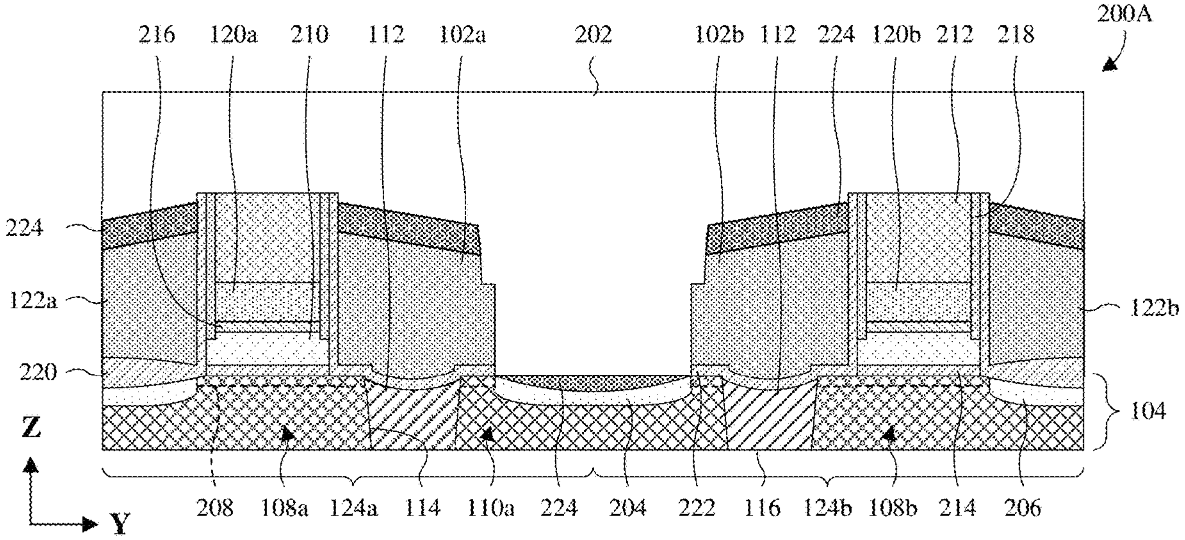
FIGS. 2A and 2B illustrate cross-sectional views of various embodiments of the integrated memory chip of FIG. 1.

With reference to FIG. 2A, a cross-sectional view 200A of some embodiments of the integrated memory chip of FIG. 1 is provided. The cross-sectional view 200A may, for example, be taken along line A in FIG. 1. The first and second word lines 102*a*, 102*b*, the first and second control gates 120*a*, 120*b*, and the first and second erase gates 122*a*, 122*b* are covered by an interconnect dielectric layer 202.

The interconnect dielectric layer 202 may be or comprise, for example, a low k dielectric and/or some other suitable dielectric(s).

Additionally, first and second word lines 102*a*, 102*b*, the first and second control gates 120*a*, 120*b*, and the first and second erase gates 122*a*, 122*b* overlie the substrate 104 and the isolation structure 112. The isolation structure 112 protrudes into a top of the substrate 104 to demarcate the first and second erase-side device regions 108*a*, 108*b* and the word-line-side device region 110*a*. In some embodiments, the first and second erase-side device regions 108*a*, 108*b* and/or the word-line-side device region 110*a* are active. A region of the substrate 104 may, for example, be active in that it undergoes depletion and/or enhancement during operation of the integrated memory chip and/or may, for example, be active in that current flows through the region during operation of the integrated memory chip.

A source/drain region 204 is on the word-line-side device region 110*a* and is between and borders the first and second word lines 102*a*, 102*b*. Multiple source lines 206 are respectively on the first and second erase-side device regions 108*a*, 108*b* and respectively underlie the first and second erase gates 122*a*, 122*b*. Note that only one of the source lines 206 is labeled. The source/drain region 204 and the source lines 206 are doped regions of the substrate 104. The source/drain regions 204 and the source lines 206 may, for example, share a doping type (e.g., p-type or n-type) and/or may, for example, have opposite doping types as adjoining regions of the substrate 104.

A plurality of selectively-conductive channels 208 is in the first and second erase-side device regions 108*a*, 108*b* and the word-line-side device region 110*a*. Note that only one of the selectively-conductive channels 208 is labeled. The selectively-conductive channels 208 extend along a top surface of the substrate 104 and underlie the first and second word lines 102*a*, 102*b* and the first and second control gates 120*a*, 120*b*. Further, the selectively-conductive channels 208 conduct depending upon bias voltages of the overlying gates (e.g., the first word line 102*a*). Because the isolation structure 112 electrically separates the source lines 206 from the source/drain region 204, the isolation structure 112 prevents the selectively-conductive channels 208 from electrically coupling the source/drain region 204 to the source lines 206.

The first and second control gates 120*a*, 120*b* overlie individual floating gates 210 and are covered by individual control-gate hard masks 212. The floating gates 210 are spaced from the substrate 104 by individual floating-gate dielectric layers 214 and are spaced from the first and second control gates 120*a*, 120*b* by individual control-gate dielectric layers 216. Note that only one of the floating gates 210, only one of the control-gate hard masks 212, only one of the floating-gate dielectric layers 214, and only one of the control-gate dielectric layers 216 are labeled. The floating gates 210 may be or comprise, for example, doped polysilicon and/or some other suitable conductive material(s). The floating-gate dielectric layers 214 may be or comprise, for example, silicon oxide and/or some other suitable dielectric(s). The control-gate hard masks 212 and/or the control-gate dielectric layers 216 may be or comprise, for example, silicon oxide, silicon nitride, some other suitable dielectric(s), or any combination of the foregoing.

The first and second control gates 120*a*, 120*b* are lined by individual control-gate sidewall spacers 218. Further, the first and second erase gates 122*a*, 122*b* are lined by individual erase-gate dielectric layers 220, and the first and second word lines 102*a*, 102*b* are lined by individual word-line dielectric layers 222. Note that only one of the control-gate sidewall spacers 218, only one of the erase-gate dielectric layers 220, and only one of the word-line dielectric layers 222 are labeled. The erase-gate dielectric layers 220 separate the first and second erase gates 122*a*, 122*b* from the floating gates 210, the control-gate sidewall spacers 218, and the substrate 104. The word-line dielectric layers 222 separate the first and second word lines 102*a*, 102*b* from the floating gates 210, the control-gate sidewall spacers 218, the substrate 104, and the isolation structure 112. The control-gate sidewall spacers 218 may be or comprise, for example, silicon oxide, silicon nitride, some other suitable dielectric(s), or any combination of the foregoing. The erase-gate dielectric layers 220 and/or the word-line dielectric layers 222 may be or comprise, for example, silicon oxide and/or some other suitable dielectric(s).

Silicide layers 224 respectively cover the first and second word lines 102*a*, 102*b*, the first and second erase gates 122*a*, 122*b*, and the source/drain region 204. Note that only some of the silicide layers 224 are labeled. The silicide layers 224 may, for example, be or comprise nickel silicide and/or some other suitable silicide. As seen hereafter, formation of the silicide layers 224 is performed after formation of the first and second word lines 102*a*, 102*b*. As such, the first and second device-region sidewalls 114, 116 are covered by the first and second word lines 102*a*, 102*b* and silicide cannot form on any portions of the first and second device-region sidewalls 114, 116 exposed during formation of the integrated memory chip. This, in turn, prevents leakage paths from extending along the first and second device-region sidewalls 114, 116, from corresponding ones of the selectively-conductive channels 208 to a bulk of the substrate 104.

Figure 2B:
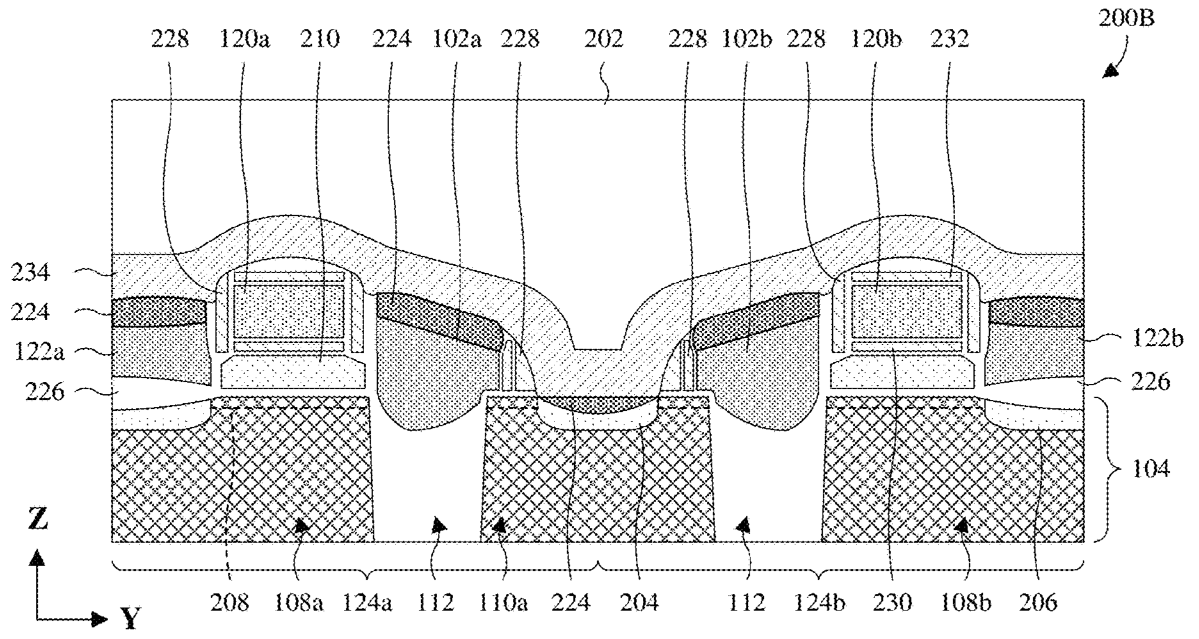

With reference to FIG. 2B, a cross-sectional view 200B of some alternative embodiments of the integrated memory chip of FIG. 2A is provided in which an inter-gate dielectric structure 226 separates the first and second word lines 102*a*, 102*b*, the first and second control gates 120*a*, 120*b*, and the first and second erase gates 122*a*, 122*b* from each other and the substrate 104. Further, the inter-gate dielectric structure 226 defines the isolation structure 112. The inter-gate dielectric structure 226 may be or comprise, for example, silicon oxide and/or some other suitable dielectric material(s).

Multiple sidewall spacers 228, multiple control-gate dielectric layers 230, and multiple control-gate hard masks 232 are in the inter-gate dielectric structure 226. Note that only some of the sidewall spacers 228, only one of the control-gate dielectric layers 230, and only one of the control-gate hard masks 232 are labeled. The sidewall spacers 228 are respectively on and/or along sidewalls of the first and second control gates 120*a*, 120*b* and the first and second word lines 102*a*, 102*b*. The control-gate dielectric layers 230 respectively overlie the floating gates 210, between the floating gates 210 and the first and second control gates 120*a*, 120*b*. The control-gate hard masks 212 respectively cover the first and second control gates 120*a*, 120*b*. The sidewall spacers 228, the control-gate dielectric layers 230, and the control-gate hard masks 232 may be or comprise, for example, silicon nitride and/or some other suitable dielectric(s). In some embodiments, the inter-gate dielectric structure 226 is or comprises silicon oxide, whereas the sidewall spacers 228, the control-gate dielectric layers 230, and the control-gate hard masks 232 are or comprise silicon nitride. Other materials are, however, amenable.

A contact etch stop layer 234 underlies the interconnect dielectric layer 202 and covers the first and second word lines 102*a*, 102*b*, the first and second control gates 120*a*, 120*b*, and the first and second erase gates 122*a*, 122*b*. During formation of the integrated memory chip, the contact etch stop layer 234 serves as an etch stop while etching contact-via openings in the interconnect dielectric layer 202. Note that no contact vias are shown in the cross-sectional view 200B. The contact etch stop layer 234 may be or comprise, for example, silicon carbide, silicon nitride, some other suitable dielectric(s), or any combination of the foregoing.

Figure 3A:
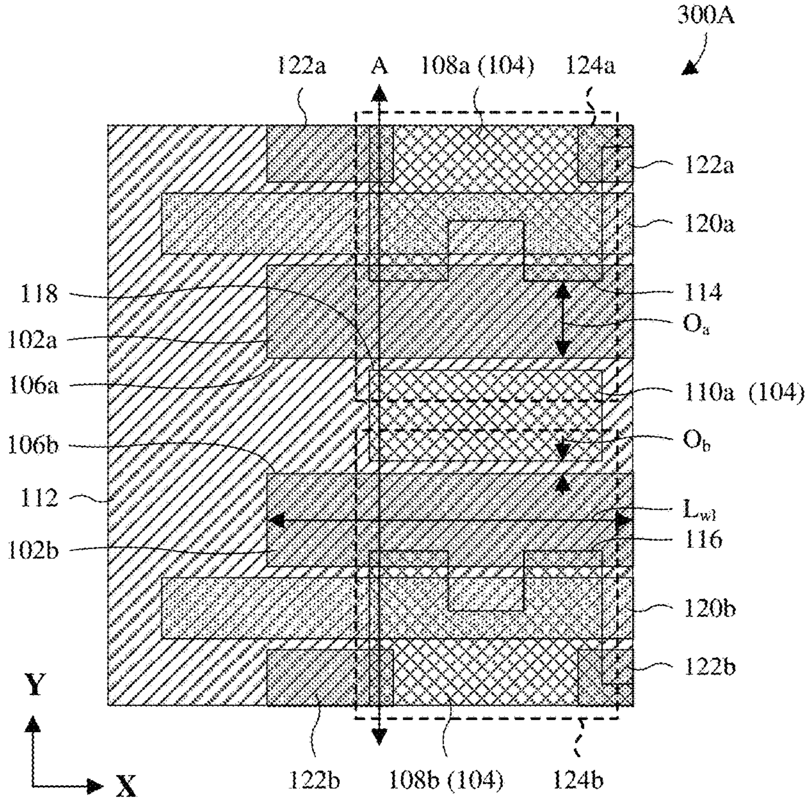
FIGS. 3A-3C illustrate top layouts of some alternative embodiments of the integrated memory chip of FIG. 1 in which the enhanced device-region layout is varied.
Figure 3B:
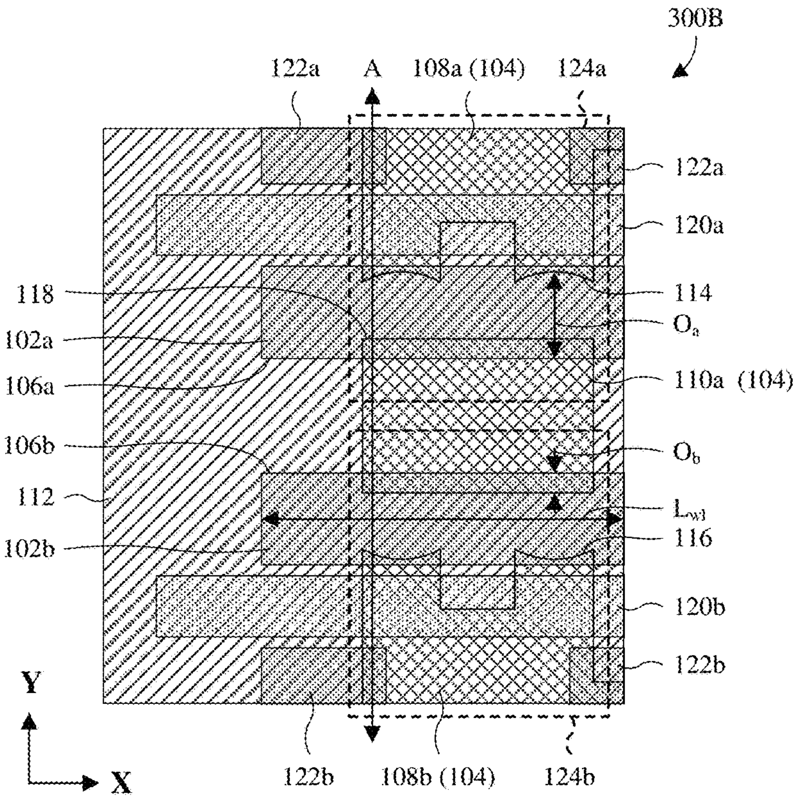
Figure 3C:
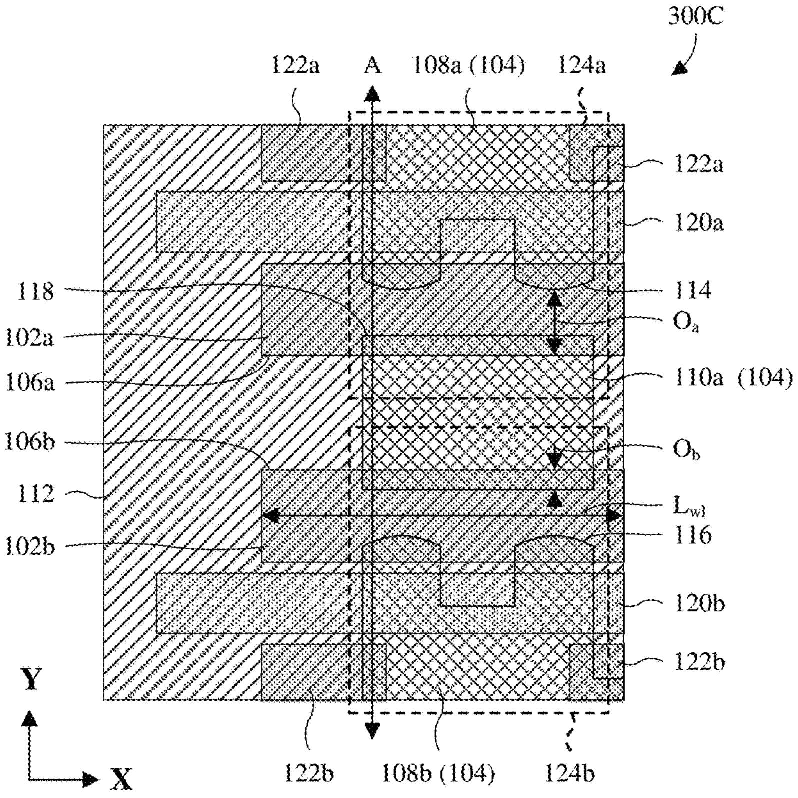

With reference to FIGS. 3A-3C, top layouts 300A-300C of some alternative embodiments of the integrated memory chip of FIG. 1 are provided in which the enhanced device-region layout is varied. As illustrated by the top layout 300A of FIG. 3A, the word-line-side device region 110*a* is laterally between and spaced from the first and second word lines 102*a*, 102*b*. Hence, the second offset $O_b$ is negative in FIG. 3A, and positive in FIG. 1, or vice versa. As illustrated by the top layout 300B of FIG. 3B, the first device-region sidewalls 114 are curved so edges of the first device-region sidewalls 114 are farther from the first control gate 120*a* than centers of the first device-region sidewalls 114. Further, the second device-region sidewalls 116 are similarly curved. As illustrated by the top layout 300C of FIG. 3C, the first device-region sidewalls 114 are curved so edges of the first device-region sidewalls 114 are closer to the first control gate 120*a* than centers of the first device-region sidewalls 114. Further, the second device-region sidewalls 116 are similarly curved. While not shown, the word-line-side device region 110*a* may be laterally between and spaced from the first and second word lines 102*a*, 102*b*, as illustrated in FIG. 3A, in alternative embodiments of FIGS. 3B and 3C.

Figure 4A:
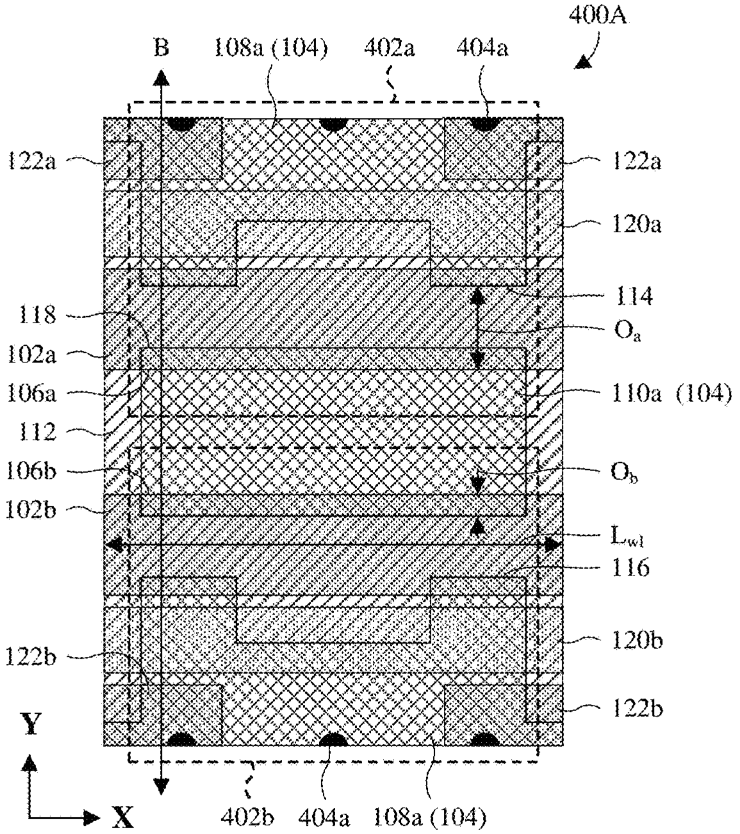
FIGS. 4A-4C illustrate top layouts of various embodiments of an integrated memory chip comprising a pair of strap cells with the enhanced device-region layout of FIG. 1.

With reference to FIG. 4A, a top layout 400A of some embodiments of an integrated memory chip comprising a pair of source-line/erase-gate (SLEG) strap cells with the enhanced device-region layout of FIG. 1 is provided. The pair of SLEG strap cells comprises a first SLEG strap cell 402*a* and a second SLEG strap cell 402*b*. The first and second SLEG strap cells 402*a*, 402*b* are on the word-line-side device region 110*a* and are respectively on the first and second erase-side device regions 108*a*, 108*b*. The first and second erase-side device regions 108*a*, 108*b* and the word-line-side device region 110*a* are as described in FIG. 1.

The first SLEG strap cell 402*a* is defined in part by the first word line 102*a*, the first control gate 120*a*, and the first erase gate 122*a*, whereas the second SLEG strap cell 402*b* is defined in part by the second word line 102*b*, the second control gate 120*b*, and the second erase gate 122*b*. In some embodiments, the first and second SLEG strap cell 402*a*, 402*b* have the same cross section or a similar cross section as the first and second boundary cells 124*a*, 124*b* of FIG. 1. Hence, the cross-sectional view 200A of FIG. 2A and/or the cross-sectional view 200B of FIG. 2B may, for example, be taken along line B in FIG. 4A.

The first and second SLEG strap cells 402*a*, 402*b* provide locations at which the first and second erase gates 122*a*, 122*b* are electrically coupled to erase-gate strap lines (not shown). Further, the first and second SLEG strap cells 402*a*, 402*b* provide locations at which source lines (not shown; see, e.g., the source lines 206 in FIGS. 2A and 2B) are electrically coupled to source-line strap lines (not shown). The electrical coupling from the first and second SLEG strap cells 402*a*, 402*b* to the erase-gate and source-line strap lines may, for example, be performed in part by a plurality of contact vias 404*a* on the first and second SLEG strap cells 402*a*, 402*b*. Note that only some of the contact vias 404*a* are labeled.

The erase-gate and source-line strap lines are elongated in parallel with the first and second erase gates 122*a*, 122*b* and the source lines. Further, the erase-gate and source-line strap lines have lower resistances than the first and second erase gates 122*a*, 122*b* and the source lines. Hence, electrically coupling the first and second erase gates 122*a*, 122*b* to the erase-gate strap lines at the first and second SLEG strap cells 402*a*, 402*b*, and other SLEG strap cells along the first and second erase gates 122*a*, 122*b*, reduces resistances and voltage drops along the first and second erase gates 122*a*, 122*b*. Further, electrically coupling the source lines to the source-line strap lines at the first and second SLEG strap cells 402*a*, 402*b*, and other SLEG strap cells along the source lines, reduces resistances and voltage drops along the source lines.

Figure 4B:
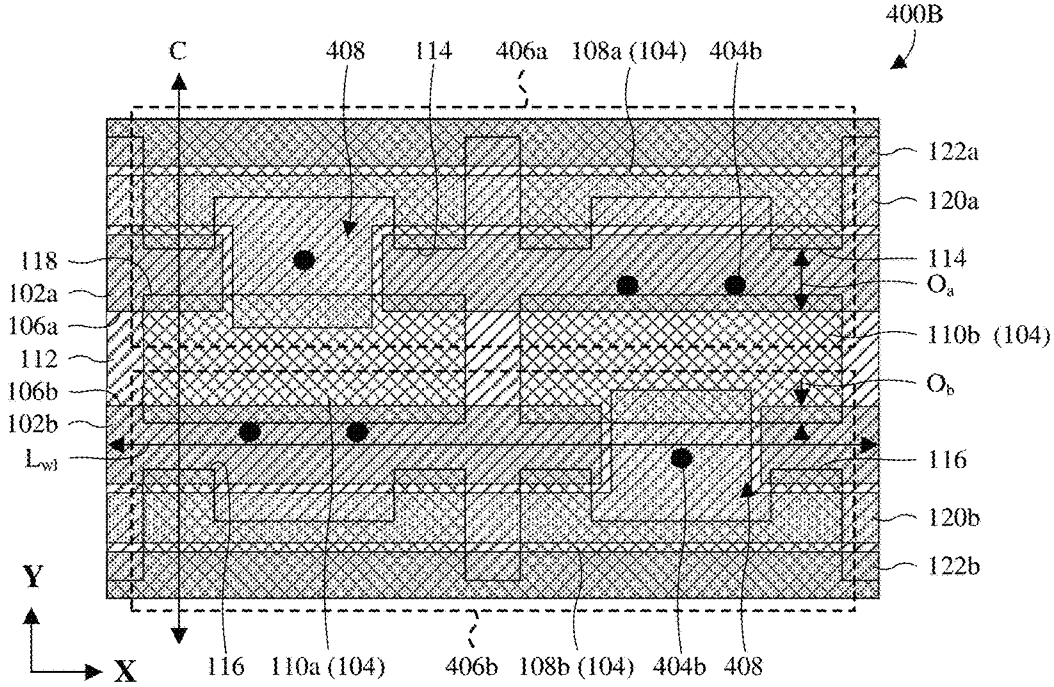

With reference to FIG. 4B, a top layout 400B of some embodiments of an integrated memory chip comprising a pair of control-gate/word-line (CGWL) strap cells with the enhanced device-region layout of FIG. 1 is provided. The pair of CGWL strap cells comprises a first CGWL strap cell 406*a* and a second CGWL strap cell 406*b*. The first and second CGWL strap cells 406*a*, 406*b* are on the word-line-side device region 110*a* and are respectively on the first and second erase-side device regions 108*a*, 108*b*. Further, the first and second CGWL strap cells 406*a*, 406*b* are on a second word-line-side device region 110*b*. The first and second erase-side device regions 108*a*, 108*b* and the word-line-side device region 110*a* are as described and illustrated in FIG. 1, except the first and second erase-side device regions 108*a*, 108*b* each protrude crosswise to the word-line lengths $L_{w1}$ at four or more locations (compared to two or more location in FIG. 1). Further, the second word-line-side device region 110*b* is as the word-line-side device region 110*a* is described and illustrated in FIG. 1.

The first CGWL strap cell 406*a* is defined in part by the first word line 102*a*, the first control gate 120*a*, and the first erase gate 122*a*, whereas the second CGWL strap cell 406*b* is defined in part by the second word line 102*b*, the second control gate 120*b*, and the second erase gate 122*b*. In some embodiments, the first and second CGWL strap cell 406*a*, 406*b* have the same cross section or a similar cross section as the first and second boundary cells 124*a*, 124*b* of FIG. 1. Hence, the cross-sectional view 200A of FIG. 2A and/or the cross-sectional view 200B of FIG. 2B may, for example, be taken along line C in FIG. 4B.

The first and second CGWL strap cells 406*a*, 406*b* provide locations at which the first and second control gates 120*a*, 120*b* are electrically coupled to control-gate strap lines (not shown). For example, the first and second control gates 120*a*, 120*b* may have pad regions 408 at the first and second CGWL strap cells 406*a*, 406*b* to electrically couple the first and second control gates 120*a*, 120*b* to the control-gate strap lines. Further, the first and second CGWL strap cells 406*a*, 406*b* provide locations at which the first and second word lines 102*a*, 102*b* are electrically coupled to word-line strap lines (not shown). The electrical coupling from the first and second CGWL strap cells 406*a*, 406*b* to the control-gate and word-line strap lines may, for example, be performed in part by a plurality of contact vias 404*b* on the first and second CGWL strap cells 406*a*, 406*b*. Note that only some of the contact vias 404*b* are labeled.

The control-gate and word-line strap lines are elongated in parallel with the first and second control gates 120*a*, 120*b* and the first and second word lines 102*a*, 102*b*. Further, the control-gate and word-line strap lines have lower resistances than the first and second control gates 120*a*, 120*b* and the first and second word lines 102*a*, 102*b*. Hence, electrically coupling the first and second control gates 120*a*, 120*b* to the control-gate strap lines at the first and second CGWL strap cells 406*a*, 406*b*, and other CGWL strap cells along the first and second control gates 120*a*, 120*b*, reduces resistances and voltage drops along the first and second control gates 120*a*, 120*b*. Further, electrically coupling the first and second word lines 102*a*, 102*b* to the word-line strap lines at the first and second CGWL strap cells 406*a*, 406*b*, and other CGWL strap cells along the first and second word lines 102*a*, 102*b*, reduces resistances and voltage drops along the first and second word lines 102*a*, 102*b*.

Figure 4C:
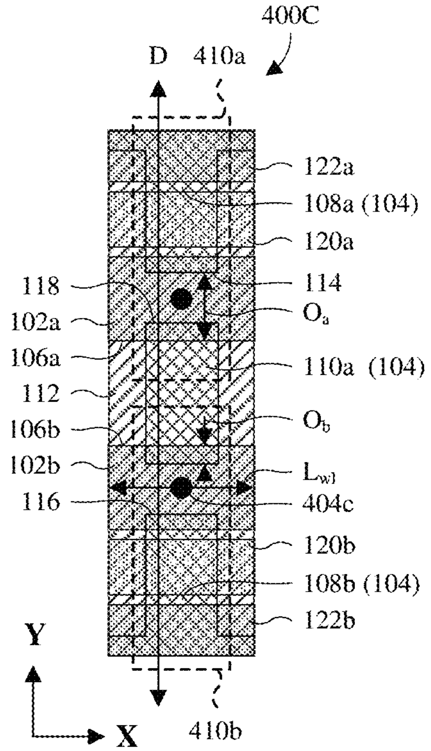

With reference to FIG. 4C, a top layout 400C of some embodiments of an integrated memory chip comprising a pair of word-line strap cells with the enhanced device-region layout of FIG. 1 is provided. The pair of word-line strap cells comprises a first word-line strap cell 410*a* and a second word-line strap cell 410*b*. The first and second word-line strap cells 410*a*, 410*b* are on the word-line-side device region 110*a* and are respectively on the first and second erase-side device regions 108*a*, 108*b*. The first and second erase-side device regions 108*a*, 108*b* and the word-line-side device region 110*a* are as described and illustrated in FIG. 1, except the first and second erase-side device regions 108*a*, 108*b* each protrude crosswise to the word-line lengths $L_{w1}$ at one or more locations (compared to two or more locations in FIG. 1).

The first word-line strap cell 410*a* is defined in part by the first word line 102*a*, the first control gate 120*a*, and the first erase gate 122*a*, whereas the second word-line strap cell 410*b* is defined in part by the second word line 102*b*, the second control gate 120*b*, and the second erase gate 122*b*. In some embodiments, the first and second word-line strap cells 410*a*, 410*b* have the same cross section or a similar cross section as the first and second boundary cells 124*a*, 124*b* of FIG. 1. Hence, the cross-sectional view 200A of FIG. 2A and/or the cross-sectional view 200B of FIG. 2B may, for example, be taken along line D in FIG. 4C.

The first and second word-line strap cells 410*a*, 410*b* provide locations at which the first and second word lines 102*a*, 102*b* are electrically coupled to word-line strap lines (not shown). The electrical coupling from the first and second word-line strap cells 410*a*, 410*b* to the control-gate and word-line strap lines may, for example, be performed in part by a plurality of contact vias 404*c* on the first and second word-line strap cells 410*a*, 410*b*. Note that only one of the contact vias 404*c* is labeled. The word-line strap lines are elongated in parallel with the first and second word lines 102*a*, 102*b* and have lower resistances than the first and second word lines 102*a*, 102*b*. Hence, electrically coupling the first and second word lines 102*a*, 102*b* to the word-line strap lines at the first and second word-line strap cells 410*a*, 410*b*, and other word-line strap cells along the first and second word lines 102*a*, 102*b*, reduces resistances and voltage drops along the first and second word lines 102*a*, 102*b*.

While FIGS. 4A-4C are illustrated using embodiments of the enhanced device-region layout in FIG. 1, it is to be understood that FIGS. 4A-4C may alternatively use embodiments of the enhanced device-region layout in any one or combination of FIGS. 3A-3C. For example, the first and second device-region sidewalls 114, 116 in FIGS. 4A-4C may be curved as illustrated in FIG. 3B or 3C. As another example, the word-line-side device region 110*a* of FIG. 4A and/or FIG. 4C may be laterally between and spaced from the first and second word lines 102*a*, 102*b* as illustrated in FIG. 3A. As yet another example, the word-line-side device region 110*a* of FIG. 4B and the second word-line-side device region 110*b* of FIG. 4B may each be laterally between and spaced from the first and second word lines 102*a*, 102*b* as illustrated in FIG. 3A.

Figure 5:
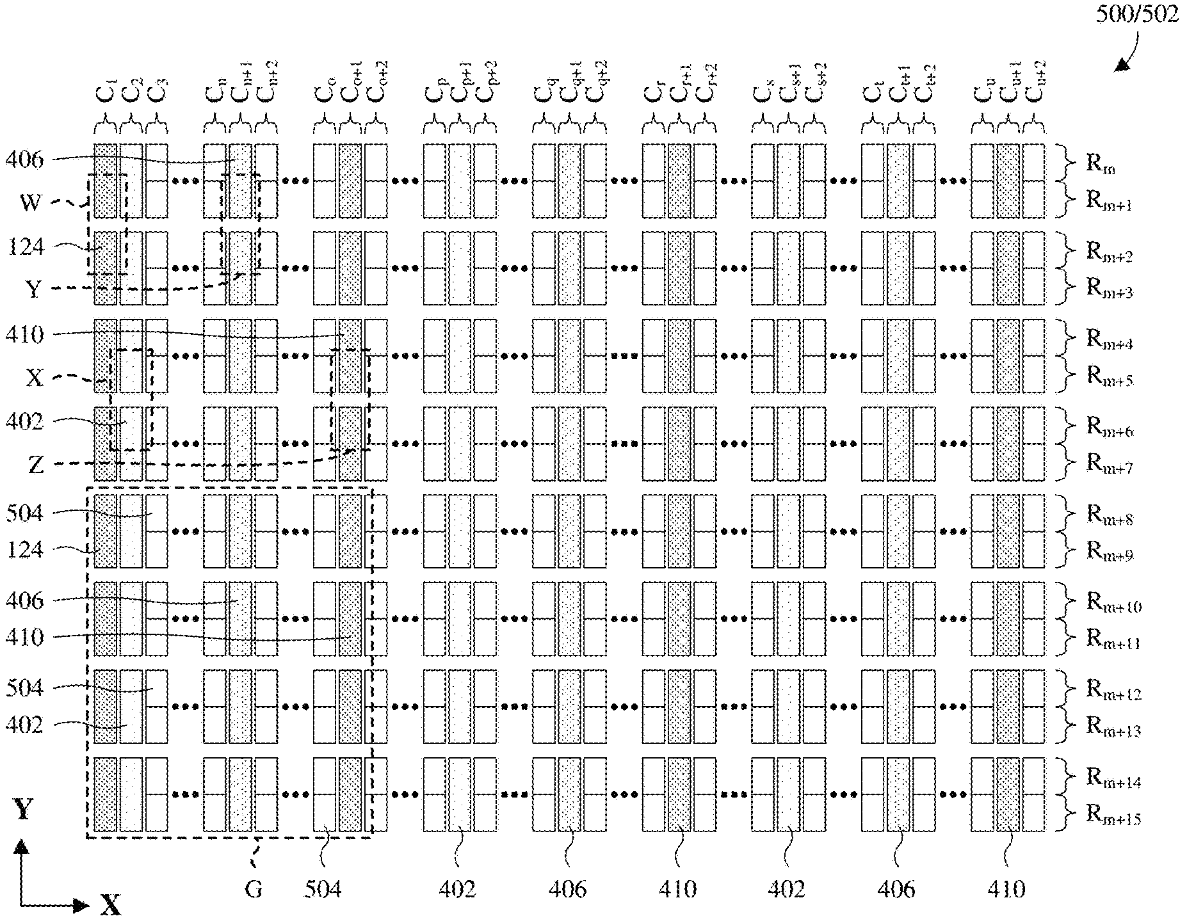
FIG. 5 illustrates a block diagram of some embodiments of an integrated memory chip comprising a memory array with boundary cells in FIG. 1 and/or the strap cells in any one or combination of FIGS. 4A-4C.

With reference to FIG. 5, a block diagram 500 of some embodiments of an integrated memory chip comprising a memory array 502 with the enhanced device-region layout of FIG. 1 is provided. The memory array 502 comprises a plurality of cells in a plurality of rows and a plurality of columns. For clarity, the rows are respectively labeled $R_m$ through $R_{m+15}$ and the columns are respectively labeled $C_1$ through $C_{u+2}$. The subscripts of the row labels identify corresponding row numbers, and the subscripts of the column labels identify corresponding column numbers. Further, m is an integer representing a row number in the memory array 502 and n through u are integers representing column numbers in the memory array 502. The plurality of cells comprises a plurality of boundary cells 124, a plurality of SLEG strap cells 402, a plurality of CGWL strap cell 406, a plurality of word-line strap cells 410, and a plurality of memory cells 504. Note that only some of each type of cell are labeled.

The boundary cells 124 are at a boundary of the memory array 502 (e.g., column $C_1$) and each span two rows. The boundary cells 124 may, for example, each be as the first and second boundary cells 124*a*, 124*b* of FIG. 1 are illustrated and described. Further, the first and second boundary cells 124*a*, 124*b* of FIG. 1 may, for example, be taken within box W and/or FIG. 1 may, for example, illustrate only portions of the first and second boundary cells 124*a*, 124*b*. As noted above, the boundary cells 124 are dummy cells at a boundary of a memory array that offset memory and strap cells from the boundary, thereby protecting the memory and strap cells from the large change in feature density at the boundary.

The SLEG strap cells 402, the CGWL strap cells 406, and the word-line strap cells 410 repeat periodically along each of the rows and each span two rows. For example, the SLEG strap cells 402 may be at columns $C_2$, $C_{p+1}$, and $C_{S+1}$, the CGWL strap cells 406 may be at columns $C_{n+1}$, $C_{q+1}$, and $C_{t+1}$, and the word-line strap cells 410 may be at columns $C_{o+1}$, $C_{r+1}$, and $C_{u+1}$. The SLEG strap cells 402 may, for example, each be as the first and second SLEG strap cells 402*a*, 402*b* of FIG. 4A are illustrated and described. Further, the first and second SLEG strap cells 402*a*, 402*b* of FIG. 4A may, for example, be taken within box X and/or FIG. 4A may, for example, illustrate only portions of the first and second SLEG strap cells 402*a*, 402*b*. The CGWL strap cells 406 may, for example, each be as the first and second CGWL strap cells 406*a*, 406*b* of FIG. 4B are illustrated and described. Further, the first and second CGWL strap cells 406*a*, 406*b* of FIG. 4B may, for example, be taken within box Y and/or FIG. 4B may, for example, illustrate only portions of the first and second CGWL strap cells 406*a*, 406*b*. The word-line strap cells 410 may, for example, each be as the first and second word-line strap cells 410*a*, 410*b* of FIG. 4C are illustrated and described. Further, the first and second word-line strap cells 410*a*, 410*b* of FIG. 4C may, for example, be taken within box Z and/or FIG. 4C may, for example, illustrate only portions of the first and second word-line strap cells 410*a*, 410*b*. As noted above, the strap cells electrically couple gates, word lines, and source lines to strap lines to reduce resistances and hence voltage drops along the gates, the word lines, and the source lines.

The memory cells 504 repeat along the rows and separate the strap cells (e.g., the word-line strap cells 410) from each other. For example, each strap cell may be separated from a neighboring strap cell along a corresponding row by 16 memory cells or some other suitable number of memory cells. The memory cells 504 may, for example, be or comprise third generation SUPERFLASH (ESF3) cells or some other suitable cells.

Figure 6A:
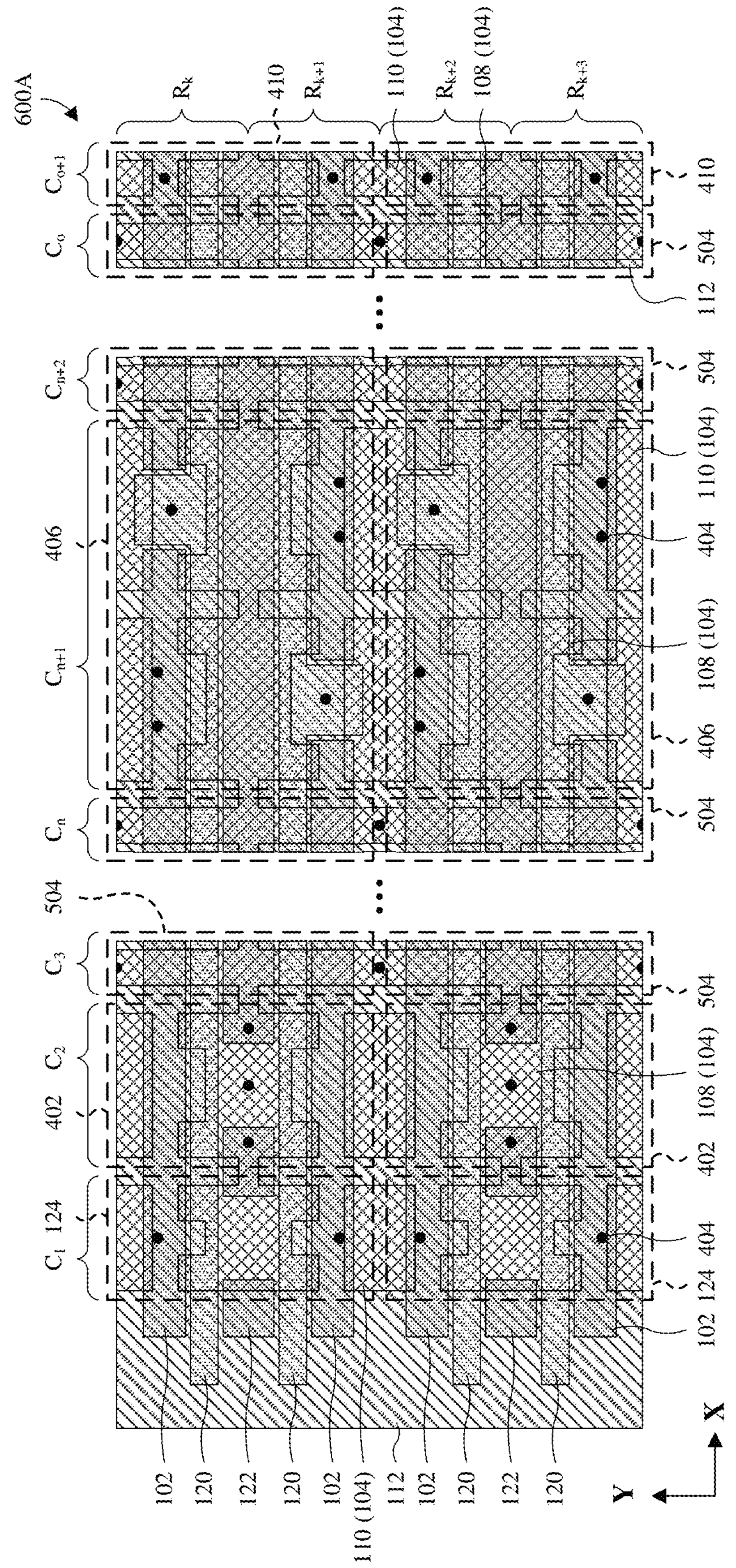
FIGS. 6A and 6B illustrate top layouts of various embodiments of an integrated memory chip comprising a boundary portion of the memory array of FIG. 5.

With reference to FIG. 6A, a top layout 600A of some embodiments of an integrated memory chip comprising a boundary portion of the memory array 502 of FIG. 5 is provided. The boundary portion may, for example, correspond to a top half of box G in FIG. 5 or a bottom half of box G in FIG. 5. A plurality of word lines 102, a plurality of control gates 120, and a plurality of erase gates 122 are on a substrate 104 and an isolation structure 112. The substrate 104 has an erase-side device region 108 and a plurality of word-line-side device regions 110. Note that only some of the word-line-side device regions 110 are labeled.

The erase-side device region 108 is laid out as described for the first and second erase-side device regions 108*a*, 108*b* of FIG. 1, such that the erase-side device region 108 protrudes crosswise to lengths of the word lines (e.g., in a Y dimension) and terminates at device-region sidewalls underlying the word lines 102. Similarly, the word-line-side device regions 110 are each laid out as described for the word-line-side device region 110*a* of FIG. 1, such that the word-line-side device regions 110 underlie neighboring word lines. By protruding to, and terminating at, device-region sidewalls underlying the word lines 102, the device-region sidewalls are covered by the word lines 102. This may, for example, prevent silicide from forming on the device-region sidewalls and hence may, for example, prevent leakage paths at the device-region sidewalls.

The word lines 102, the control gates 120, and the erase gates 122 are elongated in parallel in a first dimension (e.g., an X dimension) and are spaced from each other in a second dimension (e.g., a Y dimension). Further, the word lines 102, the control gates 120, and the erase gates 122 partially define a plurality of cells. The word lines 102, the control gates 120, and the erase gates 122 may, for example, be as the first and second word lines 102*a*, 102*b*, the first and second control gates 120*a*, 120*b*, and the first and second erase gates 122*a*, 122*b* are described in any one or combination of FIGS. 1, 2A, 2B, 3A-3C, and 4A-4C.

The plurality of cells comprises boundary cells 124, SLEG strap cells 402, CGWL strap cells 406, word-line strap cells 410, and memory cells 504. Note that only some of the memory cells 504 are labeled. The cells span columns $C_1$ through $C_{o+1}$, and further span rows $R_k$ through $R_{k+3}$, where o and k are integers respectively representing a column and a row in the memory array 502 of FIG. 5. Further, the cells are electrically coupled to wires (not shown) that are elevated above the cells (when viewed in cross section) by a plurality of contact vias 404. Note that only some of the contact vias 404 are labeled. The boundary cells 124, the SLEG strap cells 402, the CGWL strap cells 406, and the word-line strap cells 410 may, for example, be as their counterparts in FIGS. 1, 2A, 2B, 3A-3C, and 4A-4C are illustrated and/or described.

Figure 6B:
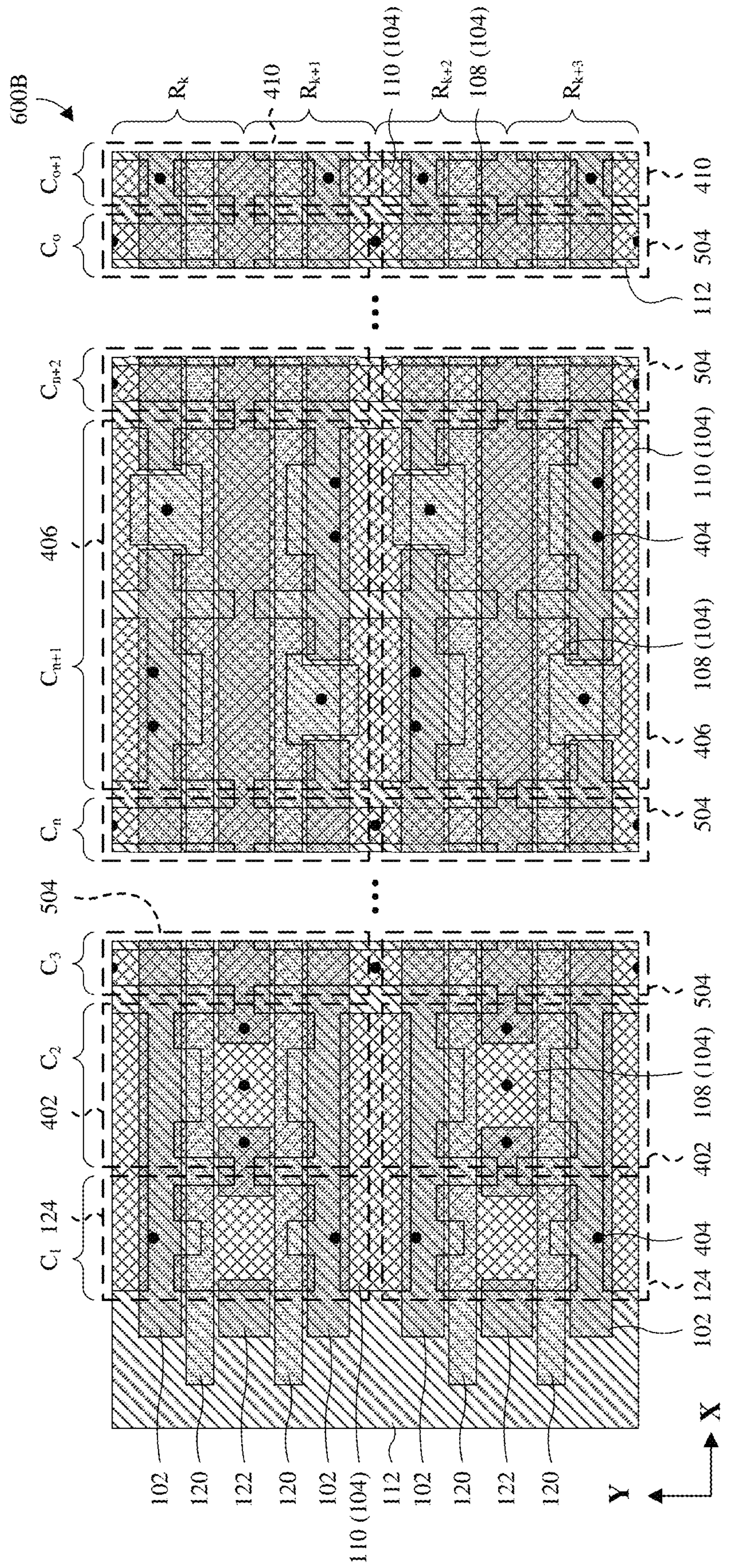

With reference to FIG. 6B, a top layout 600B of some alternative embodiments of integrated memory chip of FIG. 6A is provided in which the boundary cells 124 and the bordering SLEG strap cells 402 share word-line-side device regions 110.

While FIGS. 6A and 6B are illustrated using embodiments of the enhanced device-region layout in FIGS. 1 and 4A-4C, it is to be understood that FIGS. 6A and 6B may alternatively use embodiments of the enhanced device-region layout in any one or combination of FIGS. 3A-3C. For example, the first and second device-region sidewalls 114, 116 in FIGS. 6A and 6B may be curved as illustrated in FIG. 3B or 3C. As another example, the word-line-side device regions 110 in 6A and 6B may be laterally between and spaced from the word lines 102 as illustrated in FIG. 3A.

Figure 7:
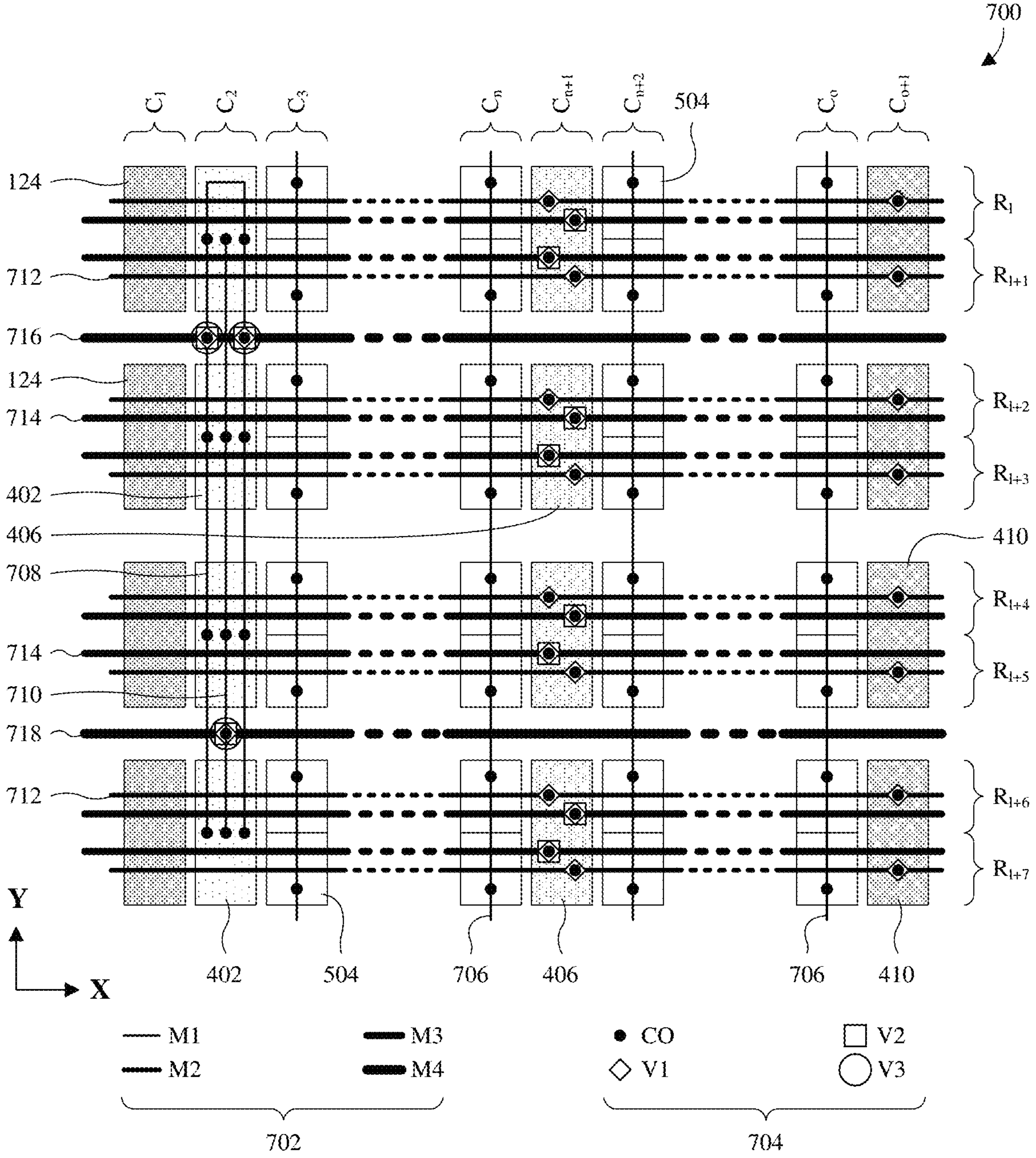
FIG. 7 illustrates a block diagram of some embodiments of an integrated memory chip comprising a boundary portion of the memory array of FIG. 5 in which a plurality of wires and a plurality of vias interconnect cells in the boundary portion.

With reference to FIG. 7, a block diagram 700 of some embodiments of an integrated memory chip comprising a boundary portion of the memory array 502 of FIG. 5 is provided in which a plurality of wires 702 and a plurality of vias 704 interconnect cells in the boundary portion. Note that the wires 702 and the vias 704 are only labeled in the legend below the boundary portion for case of illustration. The boundary portion may, for example, be taken within box G of FIG. 5 and/or some other like sized boundary portion of FIG. 5. Further, the boundary portion may, for example, correspond to rows $R_1$ through $R_{1+7}$ in the memory array 502 of FIG. 5, where 1 is an integer representing a row. The cells include boundary cells 124, SLEG strap cells 402, CGWL strap cells 406, word-line strap cells 410, and memory cells 504. Note that only some of each type of cell is labeled.

The wires 702 are grouped into a plurality of wire levels and the vias 704 are grouped into a plurality of via levels. A level corresponds to an elevation above a substrate (see, e.g., the substrate 104 in FIGS. 2A and 2B) on which the boundary portion is arranged when the integrated memory chip is viewed in cross section. The plurality of wire levels comprises a first wire level M1, a second wire level M2, a third wire level M3, and a fourth wire level M4. The wire levels are schematically illustrated by thicknesses of the wires 702 and elevation above the substrate increases with wire thickness. The plurality of via levels comprises a contact via level CO (i.e., a zero via level), a first via level V1, a second via level V2, and a third via level V3.

The via levels are schematically illustrated by shape and/or color. For example, a black circle corresponds to vias in the contact via level CO, whereas a white circle corresponds to vias in the third via level V3. As another example, a white diamond and a white square correspond to vias respectively in the first via level V1 and the second via level V2. Vias in the contact via level CO extend from the cells to wires in the first wire level M1, and vias in the first via level V1 extend from wires in the first wire level M1 to wires in the second wire level M2. Further, vias in the second via level V2 extend from wires in the second wire level M2 to wires in the third wire level M3, and vias in the third via level V3 extend from wires in the third wire level M3 to wires in the fourth wire level M4. Note that where vias are at different levels and directly overlap, the intervening wires are not shown for clarity.

The plurality of wires 702 comprises a plurality of bit lines 706, an erase-gate shunt wire 708, and a source-line shunt wire 710 in the first wire level M1. Note that only some of the bit lines 706 are labeled. The bit lines 706 correspond to columns (e.g., columns $C_3$, $C_n$, $C_{n+2}$, and $C_o$) at which the memory cells 504 are located and extend along the corresponding columns. Further, the bit lines 706 electrically couple to memory cells in the corresponding columns through vias in the contact via level CO. The erase-gate shunt wires 708 and the source-line shunt wire 710 correspond to a column (e.g., column $C_2$) at which the SLEG strap cells 402 are located and extend along the column. The erase-gate shunt wire 708 electrically couples to erase gates (not shown) at the SLEG strap cells 402 through vias in the contact via level CO. Similarly, the source-line shunt wire

710 electrically couples to source lines (not shown) at the SLEG strap cells 402 through vias in the contact via level CO.

Additionally, the plurality of wires 702 comprises a plurality of word-line strap lines 712, a plurality of control-gate strap lines 714, an erase-gate strap line 716, and a source-line strap line 718. Note that only some of the word-line strap lines 712 and only some of the control-gate strap lines 714 are labeled. The word-line strap lines 712 are in the second wire level M2. Further, the word-line strap lines 712 extend along corresponding rows and electrically couple to word lines (not shown) in the corresponding rows at the CGWL strap cells 406 and the word-line strap cells 410. Such electrical coupling is through vias in the contact via level CO and the first via level V1. The control-gate strap lines 714 are in the third wire level M3. Further, the control-gate strap lines 714 extend along corresponding rows and electrically couple to control gates (not shown) in the corresponding rows at the CGWL strap cells 406. Such electrical coupling is through vias in the contact via level CO and the first and second via levels V1, V2. The erase-gate and source-line strap lines 716, 718 are in the fourth wire level M4 and extend along the rows (e.g., rows $R_{l+1}$ and row $R_{l+5}$). The erase-gate and source-line strap lines 716, 718 respectively electrically couple to the erase-gate and source-line shunt wires 708, 710 through vias in the first, second, and third via levels V1, V2, and V3.

With reference to FIGS. 8-19, a series of cross-sectional views 800-1900 of some embodiments of a method for forming an integrated memory chip comprising a pair of boundary or strap cells with an enhanced device-region layout according to aspects of the present disclosure is provided. The method may be used to form the integrated memory chip(s) from any one or combination of FIGS. 1, 2A, 2B, 3A-3C, 4A-4C, and 5-7. Additionally, the cross-sectional views 800-1900 may, for example, correspond to the cross-sectional view 200A of FIG. 2A at various stages of manufacture and/or may, for example, be taken along line A in FIG. 1, line B in FIG. 3A, line C in FIG. 3B, or line D in FIG. 3C, or any combination of the foregoing.

Figure 8:
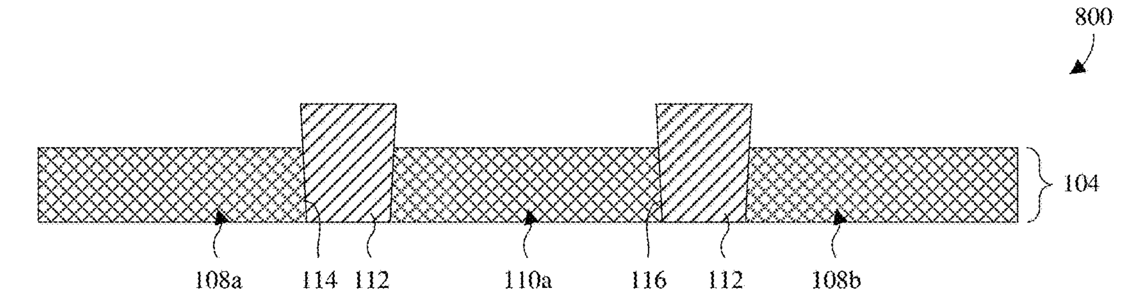
FIGS. 8-19 illustrate a series of cross-sectional views of some embodiments of a method for forming an integrated memory chip comprising a pair of boundary or strap cells with an enhanced device-region layout according to aspects of the present application.

As illustrated by the cross-sectional view 800 of FIG. 8, an isolation structure 112 is formed in a substrate 104, demarcating a first erase-side device region 108*a*, a second erase-side device region 108*b*, and a word-line-side device region 110*a*. The first and second erase-side device regions 108*a*, 108*b*, the word-line-side device region 110*a*, and the isolation structure 112 have top layouts as illustrated in any one or combination of FIGS. 1, 3A-3C, and 4A-4C. Hence, when viewed top down, the first erase-side device region 108*a* protrudes towards the second erase-side device region 108*b* and terminates at a first device-region sidewall 114. Similarly, when viewed top down, the second erase-side device region 108*b* protrudes towards the first erase-side device region 108*a* and terminates at a second device-region sidewall 116. In some embodiments, the first and second erase-side device regions 108*a*, 108*b* are connected outside the cross-sectional view 800. In some of such embodiments, the isolation structure 112 has a top layout as illustrated in FIGS. 6A and/or 6B. Further, in some embodiments, the first and second erase-side device regions 108*a*, 108*b* have a combined top layout as illustrated by the erase-side device region 108 of FIGS. 6A and/or 6B.

In some embodiments, a process for forming the isolation structure 112 comprises: 1) depositing a pad oxide layer on the substrate 104; 2) depositing a pad nitride layer on the pad oxide layer; 3) patterning the pad oxide and nitride layers with a layout of the isolation structure 112; 4) performing an etch into the substrate 104 with the pad oxide and nitride layers in place to form isolation openings; 5) filling the isolation openings with a dielectric material; and 6) removing the pad oxide and nitride layers. Other processes are, however, amenable.

Figure 9:
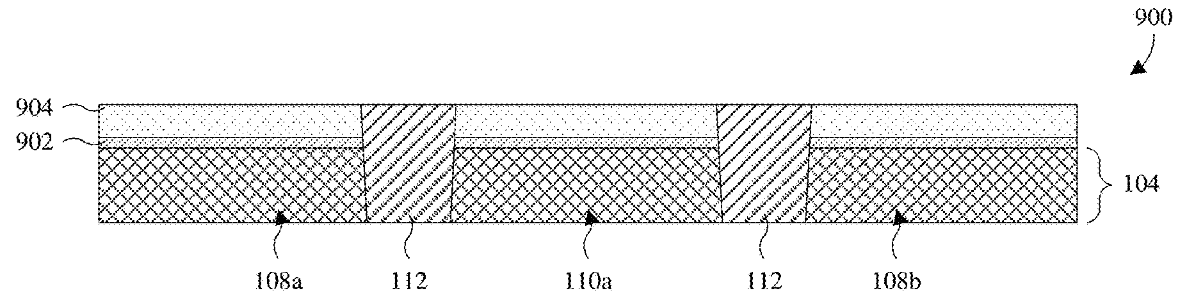

As illustrated by the cross-sectional view 900 of FIG. 9, a first dielectric layer 902 and a first conductive layer 904 (also known as a floating gate layer) are formed stacked on the substrate 104, between segments of the isolation structure 112. A process for forming the first dielectric layer 902 and the first conductive layer 904 may, for example, comprise: 1) depositing the first dielectric layer 902 on the substrate 104; 2) depositing the first conductive layer 904 on the first dielectric layer 902 and the isolation structure 112; and 3) performing a planarization into the first conductive layer 904 until the isolation structure 112 is reached. Other processes are, however, amenable. The depositing of the first dielectric layer 902 may, for example, be performed by thermal oxidation and/or some other suitable deposition process(es). The depositing of the first conductive layer 904 may, for example, be performed by vapor deposition and/or some other suitable deposition process(es).

Figure 10:
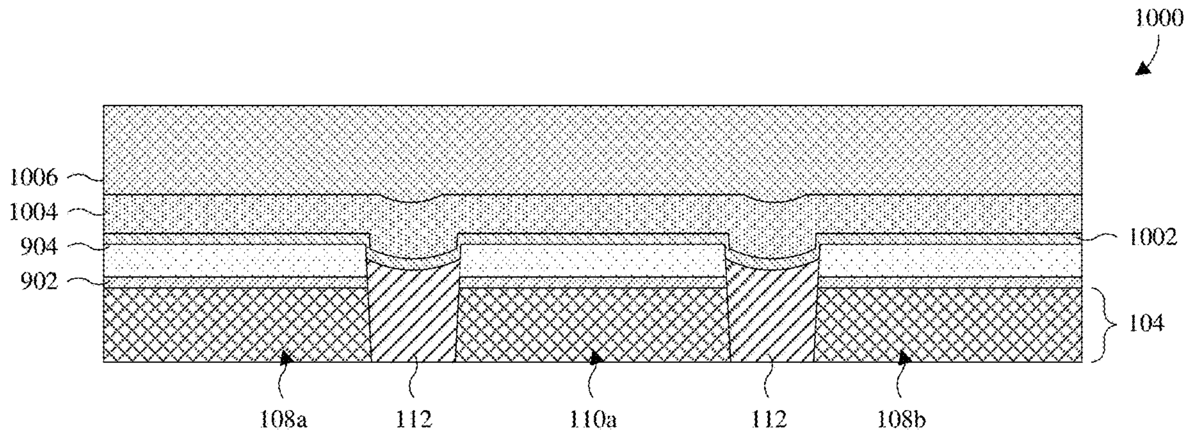

As illustrated by the cross-sectional view 1000 of FIG. 10, an etching process is performed to etch back the isolation structure 112. The etching process may, for example, be performed by a wet etch and/or some other suitable etch. The wet etch may, for example, be performed by applying a solution of hydrofluoric (HF) acid and/or some other suitable solution(s) to the isolation structure 112.

Also illustrated by the cross-sectional view 1000 of FIG. 10, a second dielectric layer 1002, a second conductive layer 1004 (also known as a control gate layer), and a hard mask layer 1006 are formed stacked over the first conductive layer 904 and the isolation structure 112. The second dielectric layer 1002 and the hard mask layer 1006 may, for example, be or comprise silicon oxide, silicon nitride, some other suitable dielectric(s), or any combination of the foregoing. In some embodiments, the second dielectric layer 1002 is or comprises an oxide-nitride-oxide (ONO) film and/or the hard mask layer 1006 is or comprises an ONO film. The second conductive layer 1004 may be or comprise, for example, doped polysilicon and/or some other suitable conductive material(s).

Figure 11:
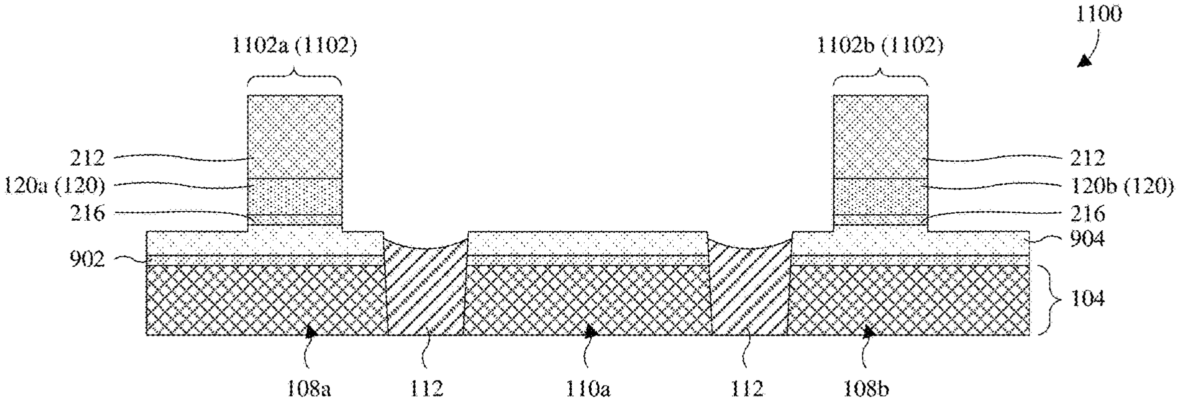

As illustrated by the cross-sectional view 1100 of FIG. 11, a plurality of control-gate stacks 1102 are formed from the second dielectric layer 1002 (see FIG. 10), the second conductive layer 1004 (see FIG. 10), and the hard mask layer 1006 (see FIG. 10). The control-gate stacks 1102 comprise individual control-gate dielectric layers 216, individual control gates 120, and individual control-gate hard masks 212. The control gates 120 respectively overlie the control-gate dielectric layers 216, and the control-gate hard masks 212 respectively overlie the control gates 120. The plurality of control-gate stacks 1102 may, for example, have the same top layout as the plurality of control gates 120 in FIG. 6A and/or FIG. 6B. Other top layouts are, however, amenable.

The plurality of control-gate stacks 1102 comprises a first control-gate stack 1102*a* and a second control-gate stack 1102*b*, and the first and second control-gate stacks 1102*a*, 1102*b* respectively comprise a first control gate 120*a* and a second control gate 120*b*. The first control-gate stack 1102*a* may, for example, have a top layout as illustrated for the first control gate 120*a* in any one or combination of FIGS. 1, 3A-3C, and 4A-4C and/or the second control-gate stack 1102*b* may, for example, have a top layout as illustrated for the second control gate 120*b* in any one or combination of FIGS. 1, 3A-3C, and 4A-4C. Other top layouts are, however, amenable.

In some embodiments, a process for forming the control-gate stacks 1102 comprises: 1) patterning the hard mask layer 1006 with a control-gate pattern; and 2) performing an etch into the second dielectric layer 1002 and the second conductive layer 1004 with the hard mask layer 1006 in place to transfer the control-gate pattern. Other processes for forming control-gate stacks 1102 are, however, amenable. The patterning may, for example, be performed by a photolithography/etching process or some other suitable patterning process.

Figure 12:
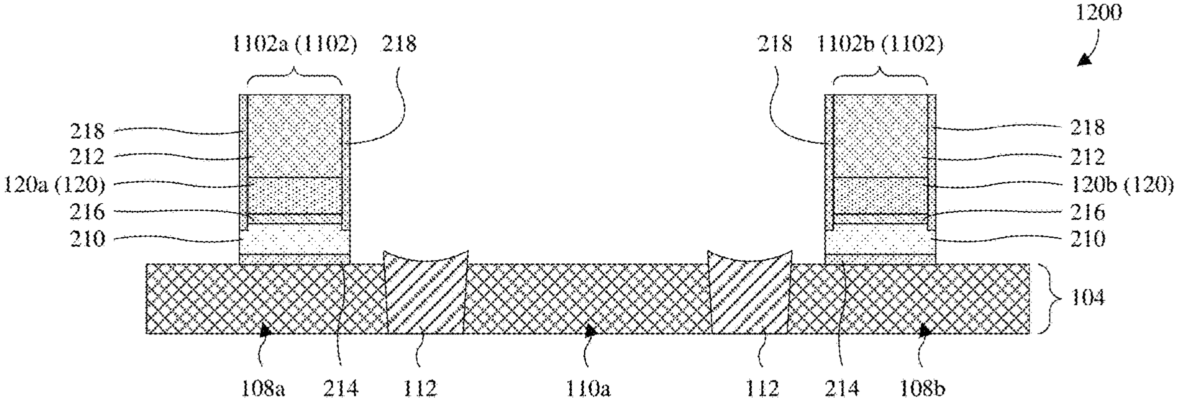

As illustrated by the cross-sectional view 1200 of FIG. 12, control-gate sidewall spacers 218 are formed on sidewalls of the control-gate stacks 1102. The control-gate sidewall spacers 218 may, for example, be or comprise silicon oxide, silicon nitride, some other suitable dielectric(s), or any combination of the foregoing. In some embodiments, the control-gate sidewall spacers 218 are or comprises an ONO film. In some embodiments, a process for forming the control-gate sidewall spacers 218 comprises: 1) depositing a sidewall spacer layer covering and lining the control-gate stacks 1102; and 2) performing an etch back into the sidewall spacer layer. Other processes are, however, amenable.

Also illustrated by the cross-sectional view 1200 of FIG. 12, floating gates 210 and floating-gate dielectric layers 214 are formed from the first conductive layer 904 (see FIG. 11) and the first dielectric layer 902 (see FIG. 11). The floating gates 210 respectively underlie the control gates 120, and the floating-gate dielectric layers 214 respectively underlie the floating gates 210. In some embodiments, a process for forming the floating gates 210 and the floating-gate dielectric layers 214 comprises: 1) performing a first etch into the first conductive layer 904 using the control-gate sidewall spacers 218 and the control-gate hard masks 212 as a mask; and 2) subsequently performing a second etch into the first dielectric layer 902 using the control-gate sidewall spacers 218 and the control-gate hard masks 212 as a mask. Other processes are, however, amenable. In some embodiments, the second etch also etches back the isolation structure 112, and/or is performed by a wet etch and/or some other suitable etch. The wet etch may, for example, be performed by applying a solution of HF acid and/or some other suitable solution(s) to the first dielectric layer 902.

Figure 13:
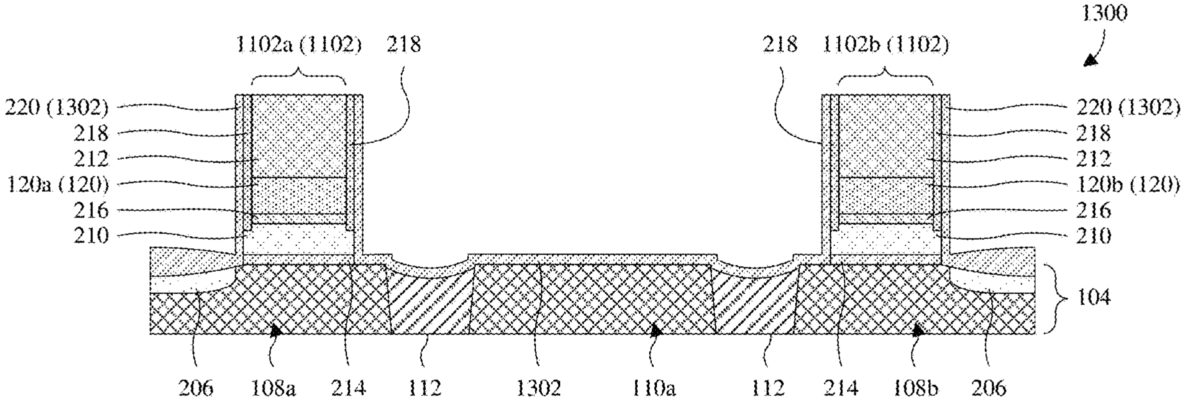

As illustrated by the cross-sectional view 1300 of FIG. 13, a third dielectric layer 1302 (also known as a gate dielectric layer) is formed on sidewalls of the control-gate sidewall spacers 218 and sidewalls of the floating gates 210. Further, the third dielectric layer 1302 is formed lining the substrate 104 and the isolation structure 112 to sides of the control-gate stacks 1102. The third dielectric layer 1302 defines erase-gate dielectric layers 220 along sidewalls of the control-gate stacks 1102 that will border erase gates (not yet formed) and may be or comprise, for example, silicon oxide and/or some other suitable dielectric(s).

A process for forming the third dielectric layer 1302 may, for example, comprise: 1) depositing a first dielectric portion of the third dielectric layer 1302 covering and lining the control-gate stacks 1102; 2) etching back the first dielectric portion; and 3) depositing a second dielectric portion of the third dielectric layer 1302 on the substrate 104. Other processes are, however, amenable. The first dielectric portion may, for example, be formed by vapor deposition and/or some other suitable deposition process(es), and/or the second dielectric portion may, for example, be formed by thermal oxidation and/or some other suitable deposition process(es). In some embodiments, while forming the third dielectric layer 1302, the isolation structure 112 is etched back. For example, the etching back of the first dielectric portion may be performed by a wet etch and/or some other suitable etch that etches back the isolation structure 112. The wet etch may, for example, be performed by applying a solution of HF acid and/or some other suitable solution(s) to the first dielectric portion.

Also illustrated by the cross-sectional view 1300 of FIG. 13, source lines 206 are formed respectively on the first and second erase-side device regions 108*a*, 108*b*. The source lines 206 are doped portions of the substrate 104 having an opposite doping type as adjoining portions of the substrate 104. Formation of the source lines 206 may, for example, be performed before, during, or after formation of the third dielectric layer 1302 and/or may, for example, be performed by ion implantation and/or some other suitable doping process(es).

Figure 14:
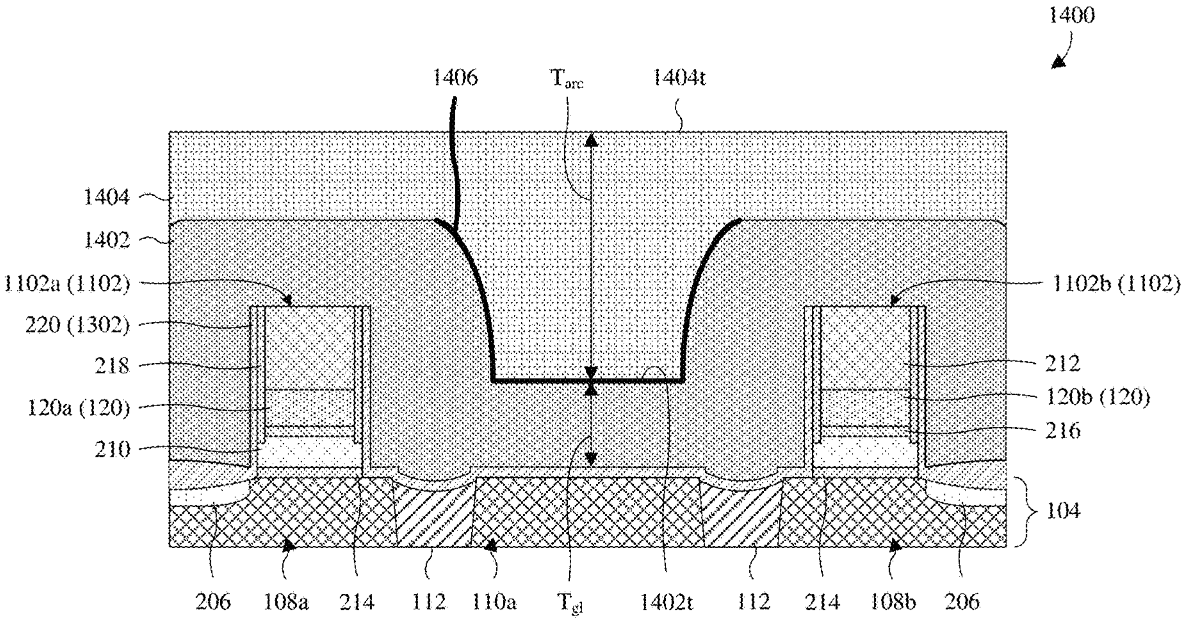

As illustrated by the cross-sectional view 1400 of FIG. 14, a third conductive layer 1402 (also known as a gate layer) and an antireflective layer 1404 are formed stacked over and covering the substrate 104 and the control-gate stacks 1102. The third conductive layer 1402 is indented at sides of the control-gate stacks 1102 due to the drop in elevation from the control-gate stacks 1102 to the spaces between the control-gate stacks 1102. For example, a first indent 1406 (filled by the antireflective layer 1404) forms between the first and second control-gate stacks 1102*a*, 1102*b* due to the drop in elevation from the first and second control-gate stacks 1102*a*, 1102*b* to the space between the first and second control-gates stacks 1102*a*, 1102*b*.

The third conductive layer 1402 has a thickness $T_{gl}$ that is uniform or substantially uniform at the first indent 1406. This may, for example, be due to formation of the third conductive layer 1402 by conformal deposition and/or some other suitable deposition. Further, the third conductive layer 1402 has a top surface 1402*t* that is planar or substantially planar at the first indent 1406. This may, for example, be because the word-line-side device region 110*a* has a planar or substantially planar top surface and limits the isolation structure 112 to sides of the first indent 1406. If not for the word-line-side device region 110*a*, the isolation structure 112 may be directly under the first indent 1406, whereby a top indent of the isolation structure 112 would lead to an indent in the top surface 1402*t* of the third conductive layer 1402. The third conductive layer 1402 may, for example, be or comprise doped polysilicon and/or some other suitable conductive material. Further, the third conductive layer 1402 may, for example, be formed by vapor deposition and/or some other suitable deposition process(es).

The antireflective layer 1404 has a top surface 1404*t* that is planar or substantially planar. In some embodiments, a process for forming the antireflective layer 1404 comprises: 1) depositing the antireflective layer 1404 as a flowable material so the top surface 1404*t* of the antireflective layer 1404 self-levels from the force of gravity; and 2) subsequently curing or hardening antireflective layer 1404. In at least some of such embodiments, the antireflective layer 1404 may, for example, be or comprise a bottom antireflective coating (BARC) material and/or some other suitable antireflective material. In other embodiments, a process for forming the antireflective layer 1404 comprises: 1) depositing the antireflective layer 1404 by vapor deposition and/or some other suitable deposition process(es); and 2) subsequently performing a planarization into the antireflective layer 1404. Other processes for forming the antireflective layer 1404 are, however, amenable. Because the antireflective layer 1404 has a top surface 1404*t* that is planar or substantially planar, and because the third conductive layer 1402 has a top surface 1402*t* that is planar or substantially planar at the first indent 1406, the antireflective layer 1404 has a thickness Tare that is uniform or substantially uniform at the first indent 1406. As seen hereafter, this uniform or substantially uniform thickness propagates to subsequent word line etching and leads to uniform or substantially uniform etch loading.

Figure 15:
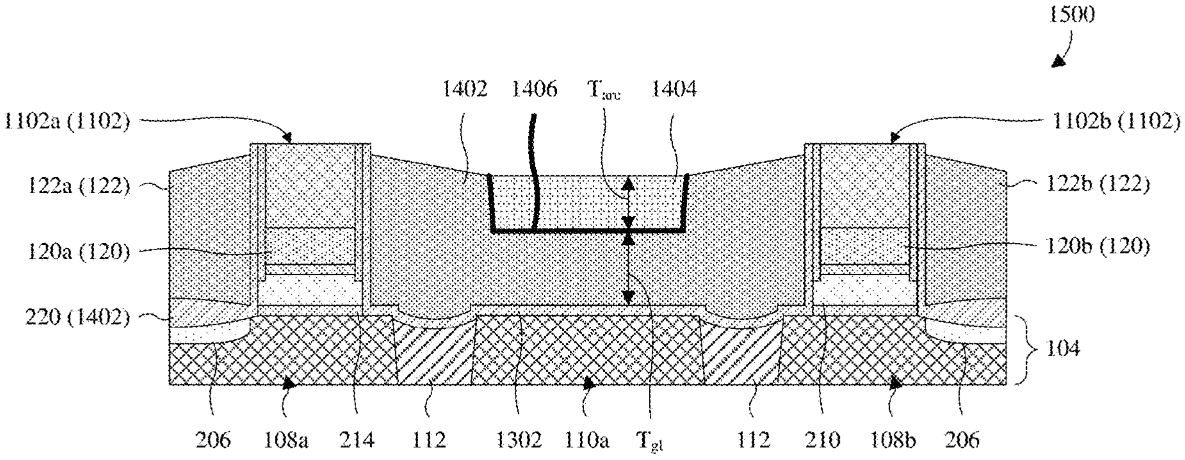

As illustrated by the cross-sectional view 1500 of FIG. 15, top surfaces respectively of the third conductive layer 1402 and the antireflective layer 1404 are recessed to below top surfaces of the control-gate stacks 1102. The recessing forms a plurality of erase gates 122 from the third conductive layer 1402. The plurality of erase gates 122 is on the erase-gate dielectric layers 220 and comprise a first erase gate 122*a* and a second erase gate 122*b* respectively on the first and second erase-side device regions 108*a*, 108*b*. The erase gates 122 may, for example, have the same top layout as the erase gates 122 in FIG. 6A and/or FIG. 6B. The first and second erase gates 122*a*, 122*b* may, for example, have the same top layouts as their counterparts in any one or combination of FIGS. 1, 3A-3C, and 4A-4C. The recessing may, for example, be performed by an etch back and/or some other suitable process(es). The etch back may, for example, comprise: 1) etching the antireflective layer 1404 until the third conductive layer 1402 is uncovered; and 2) simultaneously etching the third conductive layer 1402 and the antireflective layer 1404 until the top surface of the third conductive layer 1402 is recessed to below the top surfaces of the control-gate stacks 1102. In some embodiments, the thickness Tare of the antireflective layer 1404 remains uniform or substantially uniform at the first indent 1406 due to, for example, high uniformity of the etch back and/or the recessing.

Figure 16:
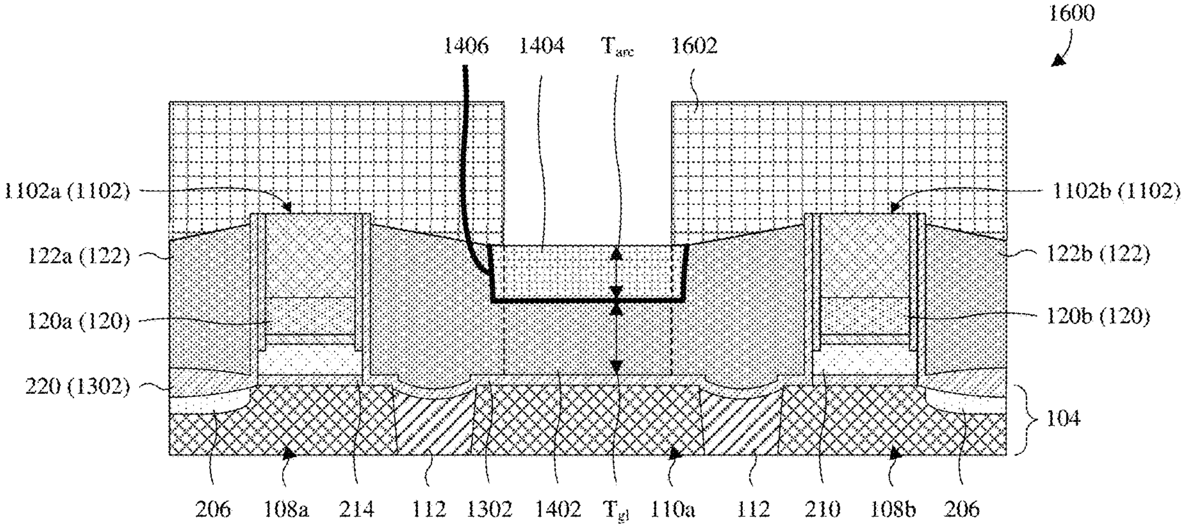

As illustrated by the cross-sectional view 1600 of FIG. 16, a word-line mask 1602 is formed on the control-gate stacks 1102, the third conductive layer 1402, and the antireflective layer 1404. The word-line mask 1602 has a word-line pattern of word lines being formed and may, for example, be or comprise photoresist, a hard mask material, some other suitable mask material(s), or any combination of the foregoing. In some embodiments in which the word-line mask 1602 is or comprise photoresist, the antireflective layer 1404 may aid in accurately forming the word-line pattern in the word-line mask 1602 by preventing or reducing light reflection during exposure of the photoresist to radiation.

Figure 17:
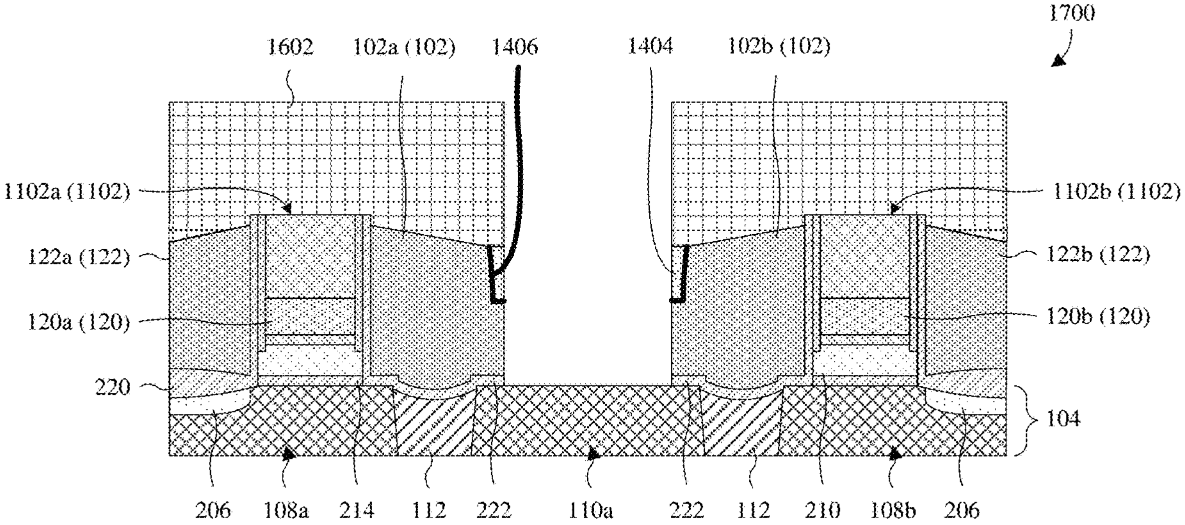

As illustrated by the cross-sectional view 1700 of FIG. 17, an etch is performed into the third dielectric layer 1302 (see FIG. 16), and the third conductive layer 1402 (see FIG. 16), and the antireflective layer 1404. The etch transfers the word-line pattern from the word-line mask 1602 to the third conductive layer 1402 and the third dielectric layer 1302, thereby forming a plurality of word lines 102 and a plurality of word-line dielectric layers 222. The word lines 102 are formed along sidewalls of the control-gate stacks 1102, and the word-line dielectric layers 222 line the word lines 102. The plurality of word lines 102 comprise a first word line 102*a* and a second word line 102*b* respectively along the first and second control-gate stacks 1102*a*, 1102*b*. The word lines 102 may, for example, have the same top layout as the plurality of word lines 102 in FIG. 6A and/or FIG. 6B. The first and second word lines 102*a*, 102*b* may, for example, have the same top layouts as their counterparts in any one or combination of FIGS. 1, 3A-3C, and 4A-4C. Other top layouts are, however, amenable.

As seen through comparison of FIGS. 16 and 17, the word-line pattern is such that the etch removes portions of the third conductive layer 1402 and portions of the antireflective layer 1404 at the first indent 1406. Because these removed portions have uniform or substantially uniform thickness Tare, Tel, as described above, the etch has uniform or substantially uniform etch loading at the first indent 1406. The uniform or substantially uniform etch loading reduces the likelihood of etch residue. Because etch residue has the potential to electrically short the first and second word lines 102*a*, 102*b* together, and the likelihood of etch residue is reduced, the likelihood of etch residue electrically shorting the first and second word lines 102*a*, 102*b* together is reduced. This, in turn, enlarges the process window (e.g., resiliency) of the etch and hence leads to increases yields.

Figure 18:
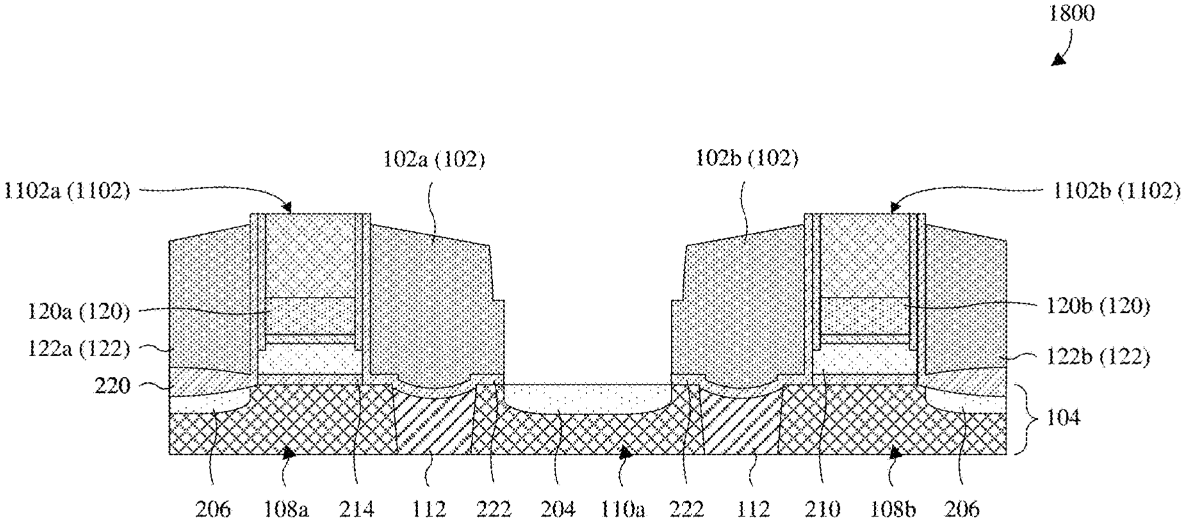

As illustrated by the cross-sectional view 1800 of FIG. 18, the antireflective layer 1404 (see FIG. 17) is removed. Further, the word-line mask 1602 (see FIG. 17) is fully or partially removed. For example, where the word-line mask 1602 is or comprises photoresist, the photoresist may be fully removed. The removing may, for example, be performed by plasma ashing and/or some other suitable removal process(es).

Also illustrated by the cross-sectional view 1800 of FIG. 18, a source/drain region 204 is formed on the word-line-side device region 110*a*, between the first and second word lines 102*a*, 102*b*. The source/drain region 204 may, for example, be a doped region of the substrate 104 having an opposite doping type as an adjoining region of the substrate 104.

Figure 19:
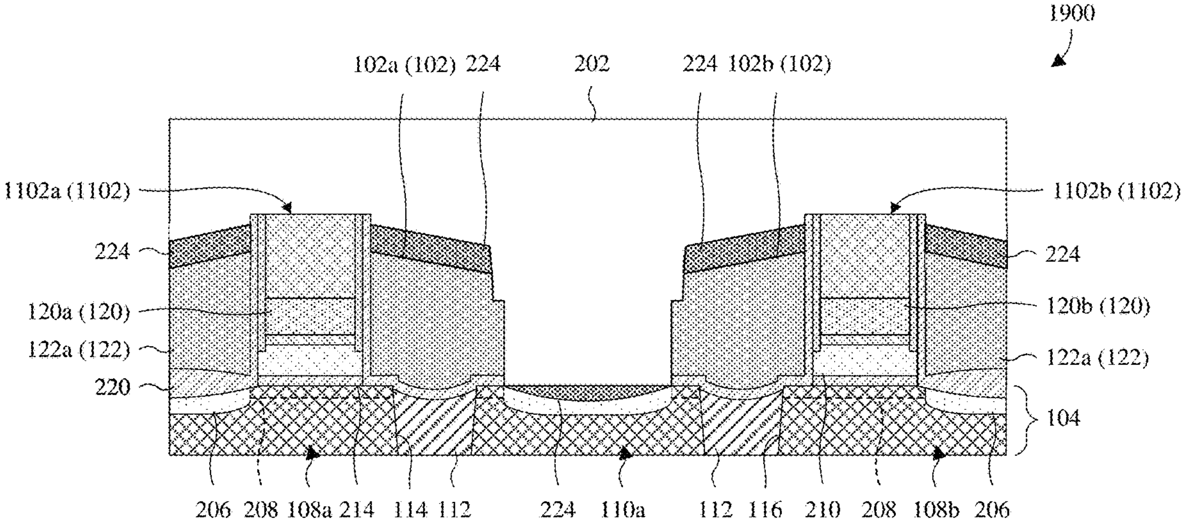

As illustrated by the cross-sectional view 1900 of FIG. 19, silicide layers 224 are formed respectively covering the first and second word lines 102*a*, 102*b*, the first and second erase gates 122*a*, 122*b*, and the source/drain region 204. The silicide layers 224 may, for example, be or comprise nickel silicide and/or some other suitable silicide.

As described above, the isolation structure 112 is subject to recessing during etching and/or cleaning processes. For example, the acts at FIGS. 10, 12, and 13 may lead to such recessing. The recessing may be of such an extent that the first and second device-region sidewalls 114, 116 of the first and second erase-side device regions 108*a*, 108*b* become exposed. Because the word lines 102 overlie the isolation structure 112 and cover the first and second device-region sidewalls 114, 116, the first and second device-region sidewalls 114, 116 are not exposed during formation of the silicide layers 224. Hence, silicide does not form on the first and second device-region sidewalls 114, 116.

If silicide formed on the first and second device-region sidewalls 114, 116, leakage paths could extend from a bulk of the substrate 104, along the of the first and second erase-side device regions 108*a*, 108*b*, to the source lines 206. For example, the leakage paths could extend from the bulk of the substrate 104, along the of the first and second erase-side device regions 108*a*, 108*b*, to selectively-conductive channels 208 underlying the first and second word lines 102*a*, 102*b*. Further, the leakage paths could extend along the selectively-conductive channels 208 to the source lines 206 if the first and second word lines 102*a*, 102*b* and the first and second control gates 120*a*, 120*b* were appropriately biased. If the leakage paths extended from the bulk of the substrate 104, along the of the first and second erase-side device regions 108*a*, 108*b*, to the source lines 206, memory cells may undergo read and/or write disturbances that potentially lead to failure. Accordingly, forming the word lines 102 covering the of the first and second erase-side device regions 108*a*, 108*b* may prevent source line leakage paths and may enhance yields.

Also illustrated by the cross-sectional view 1900 of FIG. 19, an interconnect dielectric layer 202 is formed covering the word lines 102, the control-gate stacks 1102, and the erase gates 122. In some embodiments, a plurality of wires (not shown) and a plurality of vias (not shown) are formed in the interconnect dielectric layer 202.

While FIGS. 8-19 are described with reference to a method, it will be appreciated that the structures shown in FIGS. 8-19 are not limited to the method but rather may stand alone separate of the method. Further, while FIGS. 8-19 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 20:
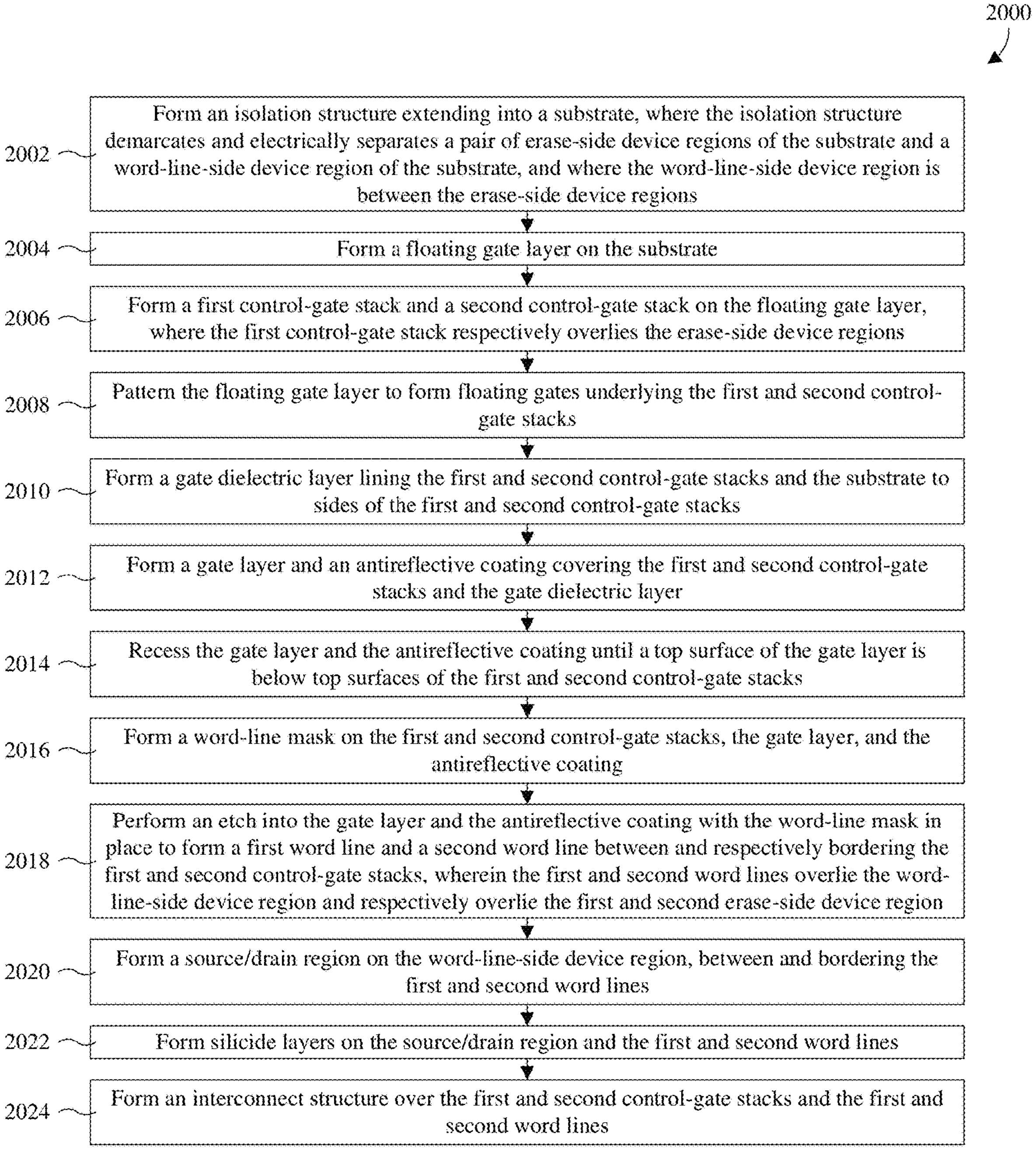
FIG. 20 is a block diagram of some embodiments of the method of FIGS. 8-19.

With reference to FIG. 20, a block diagram 2000 of some embodiments of the method of FIGS. 8-19 is provided.

At 2002, an isolation structure is formed extending into a substrate. The isolation structure demarcates and electrically separates a pair of erase-side device regions of the substrate and a word-line-side device region of the substrate. Further, the word-line-side device region is between and borders the erase-side device regions. See, for example, FIG. 8. In some embodiments, the erase-side device regions are independent of each other. In other embodiments, the erase-side device regions are one and the same.

At 2004, a floating gate layer is formed on the substrate. See, for example, FIG. 9.

At 2006, a first control-gate stack and a second control-gate stack are formed on the floating gate layer, respectively overlying the erase-side device regions. See, for example, FIGS. 10 and 11.

At 2008, the floating gate layer is patterned to form floating gates underlying the first and second control-gate stacks. See, for example, FIG. 12.

At 2010, a gate dielectric layer is formed lining the first and second control-gate stacks and the substrate to sides of the first and second control-gate stacks. See, for example, FIG. 13.

At 2012, a gate layer and an antireflective coating are formed covering the first and second control-gate stacks and the gate dielectric layer. See, for example, FIG. 14.

At 2014, the gate layer and the antireflective coating are recessed until a top surface of the gate layer is below top surfaces of the first and second control-gate stacks. See, for example, FIG. 15.

At 2016, a word-line mask is formed on the first and second control-gate stacks, the gate layer, and the antireflective coating. See, for example, FIG. 16.

At 2018, an etch is performed into the gate layer and the antireflective coating with the word-line mask in place to form a first word line and a second word line between and respectively bordering the first and second control-gate stacks. The first and second word lines overlie the word-line-side device region and respectively overlie the first and second erase-side device region. See, for example, FIG. 17.

At 2020, a source/drain region is formed on the word-line-side device region, between and bordering the first and second word lines. See, for example, FIG. 18

At 2022, silicide layers are formed on the source/drain region and the first and second word lines. See, for example, FIG. 18.

At 2024, an interconnect structure is formed over the first and second control-gate stacks and the first and second word lines. See, for example, FIG. 19.

While the block diagram 2000 of FIG. 20 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present application provides an integrated chip including: a substrate including a first device region, and further including a device-region sidewall at an edge of the first device region; an isolation structure in the substrate, wherein the isolation structure surrounds and demarcates the first device region, and further adjoins the device-region sidewall; and an erase gate, a control gate, and a word line on the first device region and spaced from each other in a first direction, wherein the control gate is between and borders the erase gate and the word line, and wherein the device-region sidewall extends laterally in a second direction transverse to the first direction and underlies the word line. In some embodiments, the substrate further includes a second device region, wherein the isolation structure extends in a closed path to completely surround and demarcate the second device region, and wherein the word line overlies the second device region. In some embodiments, the substrate further includes a first source/drain region and a second source/drain region respectively on the first and second device regions, wherein the first source/drain region underlies the erase gate, and wherein the second source/drain region borders the word line. In some embodiments, the first device region is elongated in the second direction, wherein the first device region protrudes in the first direction to the first device-region sidewall. In some embodiments, the first device region has an H-shaped portion underlying the erase gate, the control gate, and the word line. In some embodiments, a bottom surface of the word line protrudes into the isolation structure to below a top surface of the substrate.

In some embodiments, the present application provides another an integrated chip including: a substrate including a first source/drain region; a control gate and a word line on the substrate, wherein the word line is between and borders the first source/drain region and the control gate, and wherein the word line is elongated along a length of the word line; and an isolation structure extending into the substrate and having a first isolation-structure sidewall, wherein the first isolation-structure sidewall extends laterally along the length of the word line and underlies the word line. In some embodiments, the isolation structure further has a second isolation-structure sidewall, wherein the second isolation-structure sidewall extends laterally along the length of the word line, and wherein the second isolation-structure sidewall is between the first source/drain region and the first isolation-structure sidewall. In some embodiments, the second isolation-structure sidewall is directly under the word line. In some embodiments, a top surface of the isolation structure arcs continuously from the first isolation-structure sidewall to the second isolation-structure sidewall. In some embodiments, the isolation structure extends laterally in a closed path to completely enclose the first source/drain region. In some embodiments, the word line has a word-line sidewall bordering the first source/drain region and elongated along the length of the word line, wherein the word-line sidewall is offset from the first isolation-structure sidewall by at least 10 nanometers. In some embodiments, the substrate further includes a second source/drain region bordering the control gate on an opposite side of the control gate as the word line. In some embodiments, the isolation structure has a second isolation-structure sidewall extending transverse to the length of the word line, from the first isolation-structure sidewall to the second source/drain region.

In some embodiments, the present application provides a method for forming an integrated chip, the method including: forming an isolation structure extending into a substrate, wherein the isolation structure demarcates and electrically separates a first device region of the substrate and a second device region of the substrate; forming a control gate stack on the first device region; depositing a gate layer covering the control gate stack, the isolation structure, and the first and second device regions; and patterning the gate layer to form a word line bordering the control gate stack, wherein the word line overlies the isolation structure and the first and second device regions. In some embodiments, the patterning includes: etching back the gate layer until a top surface of the gate layer is below a top surface of the control gate stack; and performing an etch into the gate layer to form a word-line pattern in the gate layer. In some embodiments, the isolation structure has a pair of isolation-structure sidewalls, wherein the isolation-structure sidewalls have substantially the same lateral orientation and respectively adjoin the first and second device regions, and wherein the word line is formed directly over the isolation-structure sidewalls. In some embodiments, the patterning further forms an erase gate bordering the control gate stack on an opposite side of the control gate stack as the word line. In some embodiments, the method further includes: doping the first device region to form a first source/drain region bordering the control gate stack; and doping the second device region to form a second source/drain region bordering the word line. In some embodiments, the isolation structure has a first isolation-structure sidewall and a second isolation-structure sidewall, wherein the first and second isolation-structure sidewalls are on opposite sides of the second device region and adjoin the second device region, and wherein the gate layer has a planar profile from the first isolation-structure sidewall to the second isolation-structure sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:

a memory array overlying a substrate and comprising multiple cells in multiple columns and multiple rows;

a first erase gate, a first word line, and a first control gate that are elongated along a first row of the memory array and form cells of the memory array in the first row; and a second erase gate, a second word line, and a second control gate that are elongated along a second row of the memory array and form cells of the memory array in the second row, wherein the second row neighbors the first row;

wherein the substrate has a sidewall boundary extending in a closed path around and demarcating a device region of the substrate, wherein a majority of the device region is laterally between and laterally offset from the first and second word lines.

2. The integrated chip according to claim 1, further comprising:

a silicide layer inset into the substrate at the device region, wherein the silicide layer is spaced from the sidewall boundary.

3. The integrated chip according to claim 1, wherein a first portion of the sidewall boundary extends laterally along the first row and underlies the first word line, and wherein a second portion of the sidewall boundary extends laterally along the second row and underlies the second word line.

4. The integrated chip according to claim 1, further comprising:

a trench isolation structure inset into the substrate and adjoining the sidewall boundary in the closed path.

5. The integrated chip according to claim 1, wherein an entirety of the device region is laterally between and laterally offset from the first and second word lines.

6. The integrated chip according to claim 1, further comprising:

a third erase gate and a third word line that are elongated with the first erase gate along a third row of the memory array and form cells of the memory array in the third row, wherein the third row neighbors the first row on an opposite side of the first row as the second row.

7. The integrated chip according to claim 6, wherein the substrate has an additional sidewall boundary extending in an additional closed path around and fully demarcating an additional device region of the substrate, wherein the additional device region is localized to an opposite side of the third row as the first row, and wherein the first and third rows are between and border the device region and the additional device region.

8. An integrated chip, comprising:

a substrate comprising a first device region and a second device region;

a word line, a control gate, and an erase gate overlying the first device region, wherein the control gate is between and borders the erase gate and the word line and has a pad, and wherein the pad overlies the second device region and protrudes laterally through the word line away from the erase gate; and a trench isolation structure in the substrate and extending in a closed path around the second device region to separate the second device region from the first device region.

9. The integrated chip according to claim 8, further comprising:

a source/drain region bordering the word line in the second device region and spaced from the trench isolation structure.

10. The integrated chip according to claim 8, wherein the closed path is localized to an opposite side of the word line as the erase gate.

11. The integrated chip according to claim 8, wherein the word line and the pad respectively have a word-line sidewall and a pad sidewall that face away from the erase gate in a first direction, wherein the second device region has a device-region sidewall that faces a second direction opposite the first direction, and wherein the word-line sidewall is laterally between the pad sidewall and the device-region sidewall.

12. The integrated chip according to claim 8, wherein the substrate comprises a third device region, and wherein the integrated chip further comprises:

an additional control gate and an additional word line overlying the first device region, wherein the additional control gate is between and borders the erase gate and the additional word line and has an additional pad, wherein the additional pad overlies the third device region and protrudes laterally through the additional word line away from the erase gate, and wherein the trench isolation structure extends in an additional closed path around the third device region.

13. The integrated chip according to claim 8, further comprising:

a memory array overlying the substrate and comprising multiple cells in multiple columns and multiple rows, wherein the erase gate, the control gate, and the word line are elongated along a first row of the memory array and form cells of the memory array in the first row, and wherein the first device region is continuous from the first row to a second row of the memory array on an opposite side of the second device region as the first row.

14. An integrated chip, comprising:

a substrate comprising a first device region and a pair of second device regions;

a memory array overlying the substrate and comprising multiple cells in multiple columns and multiple rows;

an erase gate, a word line, and a control gate that are elongated along a row of the memory array and that form a first cell of the memory array in the row and a second cell of the memory array in the row, wherein the first and second cells overlie the first device region and respectively overlie the pair of second device regions; and a trench isolation structure in the substrate, wherein the trench isolation structure completely demarcates and separates the first device region and the pair of second device regions from each other when viewed top down.

15. The integrated chip according to claim 14, wherein the first device region underlies the erase gate, the word line, and the control gate.

16. The integrated chip according to claim 14, wherein the pair of second device regions are between a first portion of the first device region in the row and a second portion of the first device region in an additional row of the memory array that neighbors the row, and wherein the first device region is continuous from the first portion to the second portion.

17. The integrated chip according to claim 14, wherein the pair of second device regions have individual lengths along the row, wherein the first and second cells have individual lengths along the row, and wherein the individual lengths of the pair of second device regions are bounded respectively by the individual lengths of the first and second cells.

18. The integrated chip according to claim 17, wherein the individual lengths of the pair of second device regions are different.

19. The integrated chip according to claim 14, wherein the first device region has a plurality of H-shaped portions spaced along and connected along the row, and wherein the pair of second device regions are rectangular.

20. The integrated chip according to claim 14, wherein the erase gate, the word line, and the control gate form a plurality of first-type strap cells, including the first cell, spaced along the row and further form a plurality of second-type strap cells, including the second cell, spaced along the row.

* * * * *